US010756258B2

(12) United States Patent
Liao et al.

(10) Patent No.: US 10,756,258 B2
(45) Date of Patent: Aug. 25, 2020

(54) MEMORY DEVICE AND FABRICATION METHOD THEREOF

(71) Applicant: TAIWAN SEMICONDUCTOR MANUFACTURING CO., LTD., Hsinchu (TW)

(72) Inventors: Wei-Hao Liao, Taichung (TW); Hsi-Wen Tien, Hsinchu County (TW); Chih-Wei Lu, Hsinchu (TW); Pin-Ren Dai, New Taipei (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/860,566

(22) Filed: Jan. 2, 2018

(65) Prior Publication Data
US 2019/0165259 A1 May 30, 2019

Related U.S. Application Data

(60) Provisional application No. 62/591,117, filed on Nov. 27, 2017.

(51) Int. Cl.
| H01L 43/12 | (2006.01) |
| H01L 43/10 | (2006.01) |
| H01L 43/08 | (2006.01) |
| H01L 27/22 | (2006.01) |

(52) U.S. Cl.
CPC ............ *H01L 43/12* (2013.01); *H01L 27/228* (2013.01); *H01L 43/08* (2013.01); *H01L 43/10* (2013.01)

(58) Field of Classification Search
None
See application file for complete search history.

(56) References Cited

U.S. PATENT DOCUMENTS

| 9,431,603 | B1* | 8/2016 | Hsieh | H01L 45/04 |
| 2013/0119494 | A1* | 5/2013 | Li | H01L 43/08 257/421 |
| 2015/0187418 | A1* | 7/2015 | Tsai | G11C 13/0097 365/63 |
| 2016/0268499 | A1* | 9/2016 | You | H01L 43/12 |
| 2016/0351797 | A1* | 12/2016 | Yi | H01L 43/12 |
| 2017/0294576 | A1* | 10/2017 | Huang | H01L 43/08 |
| 2018/0226452 | A1* | 8/2018 | Nam | H01L 43/08 |

* cited by examiner

*Primary Examiner* — Benjamin P Sandvik
(74) *Attorney, Agent, or Firm* — Maschoff Brennan

(57) ABSTRACT

A method for fabricating a memory device includes forming a bottom electrode over a substrate; forming an etch stop layer over and surrounding the bottom electrode; removing at least one portion of the etch stop layer to expose the bottom electrode; forming a stack layer over the bottom electrode and a remaining portion of the etch stop layer, the stack layer comprising a resistance switching layer; and etching the stack layer to form a stack over the bottom electrode, the stack comprising a resistance switching element over the bottom electrode and a top electrode over the resistance switching element, wherein the etch stop layer has a higher etch resistance to the etching than that of the resistance switching element.

20 Claims, 20 Drawing Sheets

MEMORY DEVICE AND FABRICATION METHOD THEREOF

PRIORITY CLAIM AND CROSS-REFERENCE

This application claims priority to U.S. Provisional Application Ser. No. 62/591,117, filed Nov. 27, 2017, which is herein incorporated by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
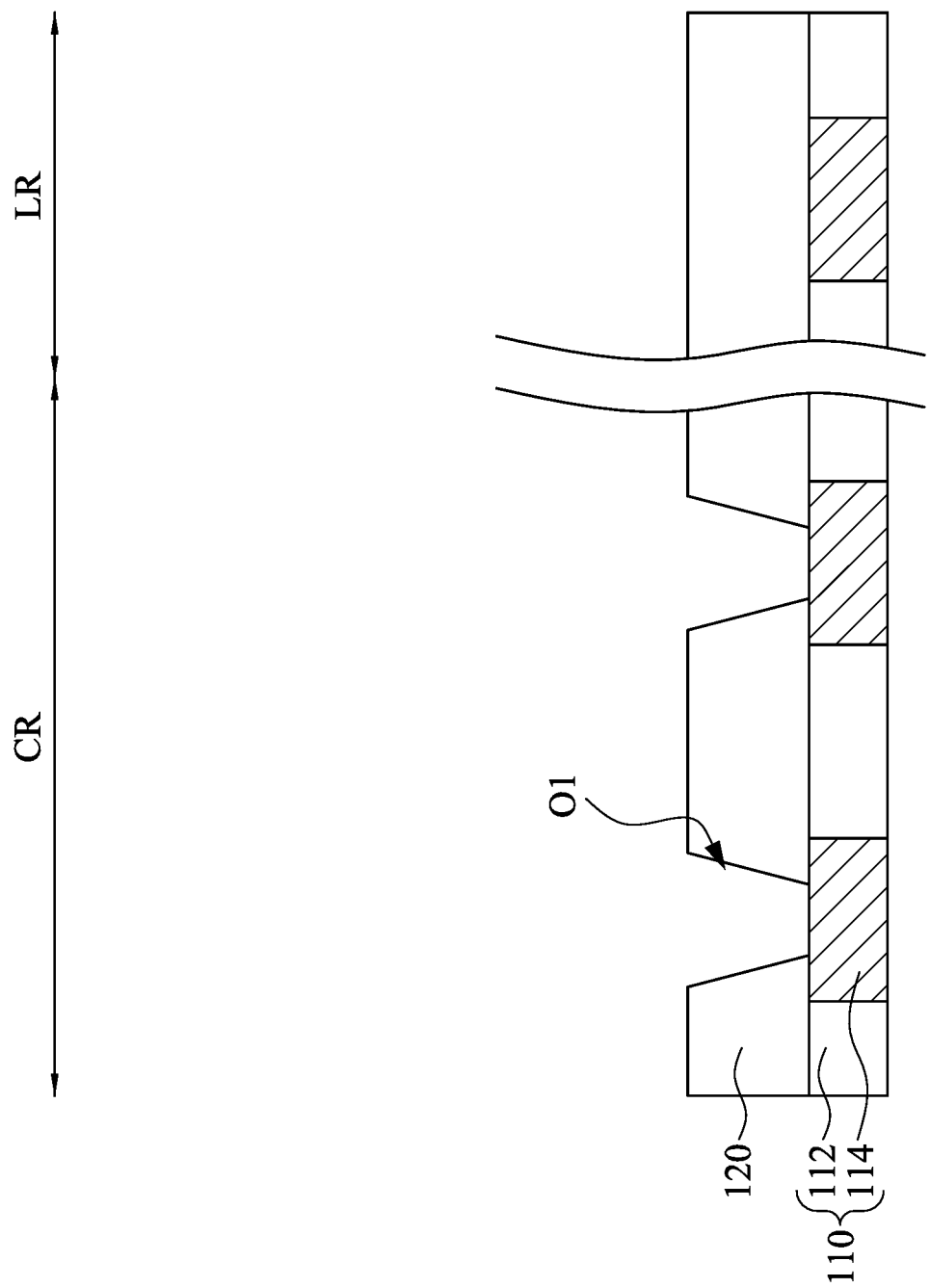
FIGS. 1-19 are cross-sectional views of the MRAM device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIGS. 1-19 are cross-sectional views of the MRAM device at various intermediate stages of manufacture according to various embodiments of the present disclosure. Various figures have been simplified for a better understanding of the inventive concepts of the present disclosure.

FIG. 1 illustrates a wafer having a substrate 110 thereon. The substrate 110 has a logic region LR where logic circuits are to be formed and a memory region CR where memory devices are to be formed. The substrate 110 includes an interlayer dielectric (ILD) layer or inter-metal dielectric (IMD) layer 112 with a metallization pattern 114. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, the like, and/or combinations thereof. Formation of the metallization pattern 114 and the ILD layer 112 may be a dual-damascene process and/or a single-damascene process. The substrate 110 may also include active and passive devices, for example, underlying the ILD layer 112. These further components are omitted from the figures for clarity.

A dielectric layer 120 is formed over the substrate 110. The dielectric layer 120 in some embodiments is silicon carbide (SiC), silicon oxynitride (SiON), silicon nitride (SiN), silicon dioxide, the like, and/or combinations thereof. The dielectric layer 120 may be a single-layered structure or a multi-layered structure. The dielectric layer 120 may be formed by acceptable deposition techniques, such as chemical vapor deposition (CVD), atomic layer deposition (ALD), physical vapor deposition (PVD), the like, and/or a combination thereof. In some embodiments, the dielectric layer 120 may have a thickness in a range of 400 to 500 angstroms.

The dielectric layer 120 is etched to form openings O1, which may expose the metallization pattern 114 in the memory region CR of the substrate 110. An exemplary formation method of the openings O1 includes forming a patterned mask may over the dielectric layer 120, and then etching the dielectric layer 120 through the patterned mask by one or more etching processes.

Figure 2:
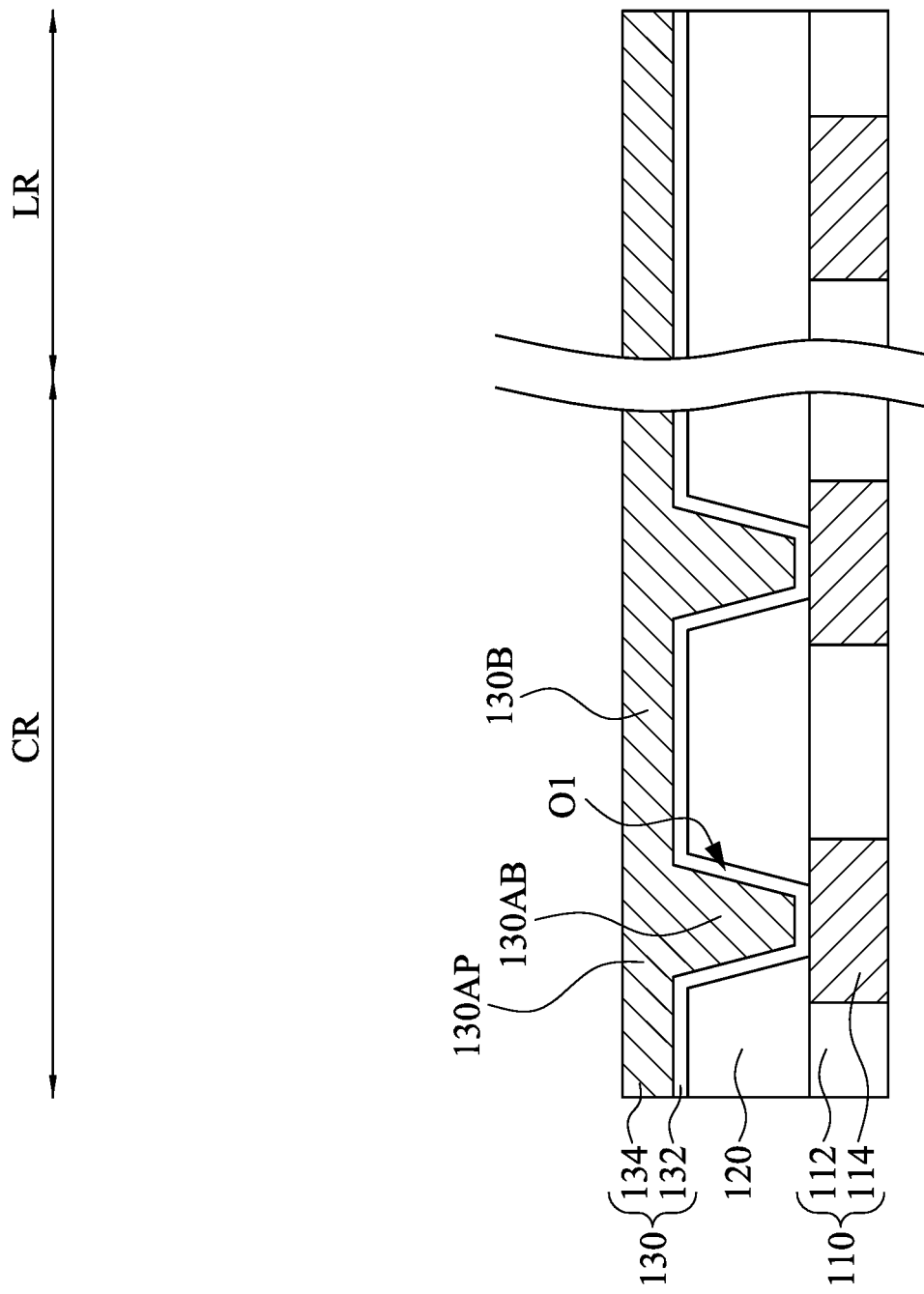

Reference is made to FIG. 2. A bottom electrode layer 130 is formed into the openings O1 in the dielectric layer 120. The bottom electrode layer 130 overfills the openings O1. In some embodiments, the bottom electrode layer 130 has portions 130AB inside the openings O1, portions 130AP over the portions 130AB and outside the openings O1, and portions 130B outside the openings O1 and next to the portions 130AB. The portions 130AB and 130B of the bottom electrode layer 130 may have a thickness in a range of 200 to 500 angstroms. In some embodiments, the bottom electrode layer 130 is a multi-layered structure and includes, for example, a diffusion barrier layer 132 and a filling metal layer 134. An exemplary formation method of the bottom electrode layer 130 includes forming in sequence the diffusion barrier layer 132 and the filling metal layer 134 into the openings O1 in the dielectric layer 120, in which the filling metal layer 134 fills recesses of the diffusion barrier layer 132.

In some embodiments, the diffusion barrier layer 132 is a titanium nitride (TiN) layer or a tantalum nitride (TaN) layer, which can act as a suitable barrier to prevent metal diffusion. Formation of the diffusion barrier layer 132 may be exemplarily performed using CVD, PVD, ALD, the like, and/or a combination thereof. In some embodiments, the filling metal layer 134 is titanium (Ti), tantalum (Ta), platinum (Pt), ruthenium (Ru), tungsten (W), aluminum (Al), copper (Cu), the like, and/or combinations thereof. Formation of the filling metal layer 134 may be exemplarily performed using CVD, PVD, ALD, the like, and/or a combination thereof. In some embodiments, after the formation of the bottom electrode layer 130, a planarization process, such as a chemical-mechanical polish (CMP) process, may be performed.

Figure 3:
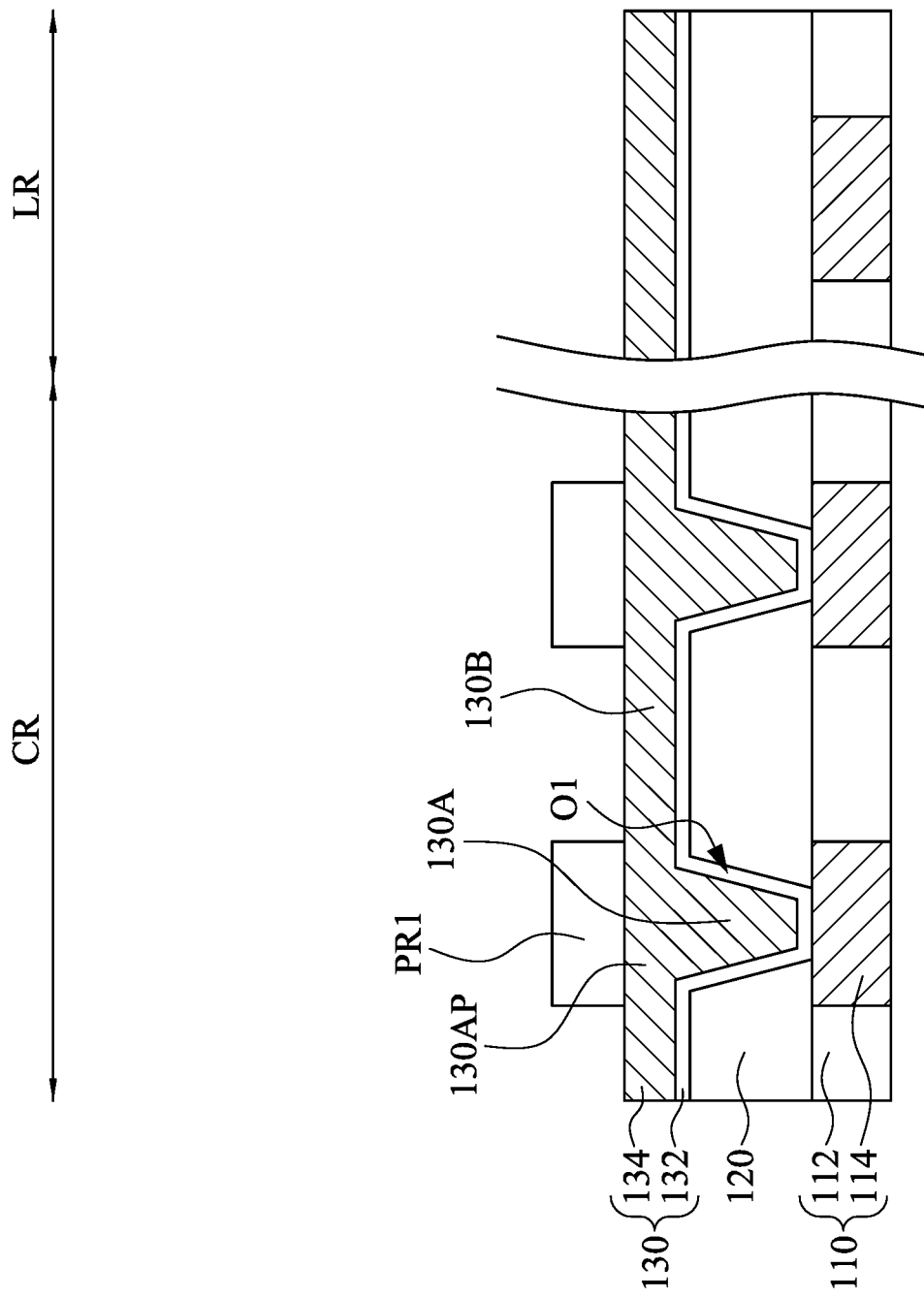

Reference is made to FIG. 3. A patterned resist mask PR1 is formed over the bottom electrode layer 130. To be specific, the patterned mask PR1 covers the portions 130AB and the portions AP of the bottom electrode layer 130 and exposes the portions 130B of the bottom electrode layer 130.

Figure 4:
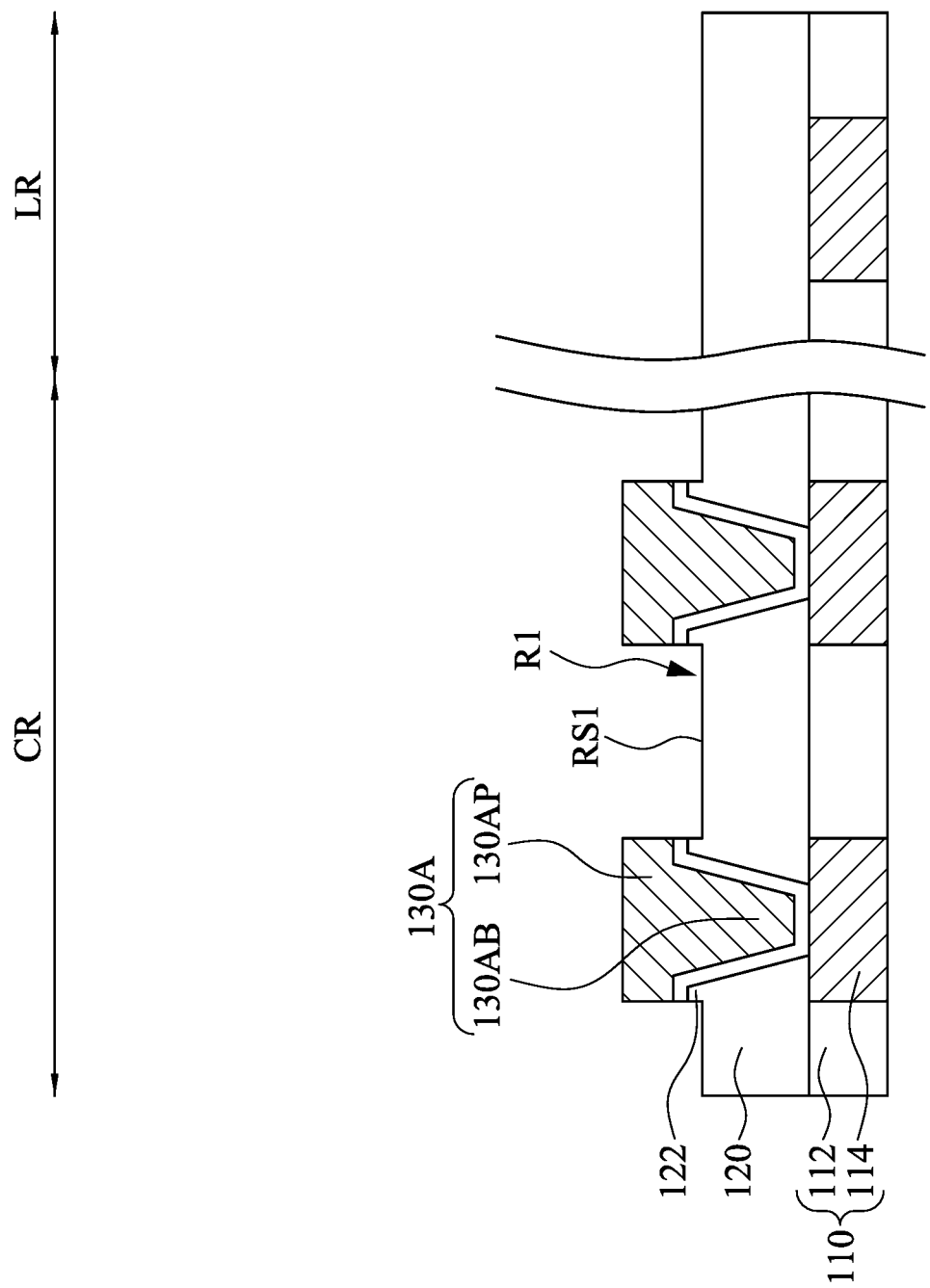

Reference is made to FIG. 4. The exposed portions 130B of the bottom electrode layer 130 are removed, while leaving the portions 130AB and the portions 130AP of the bottom electrode layer 130 covered by the patterned mask PR1. In some embodiments, the removal is performed by an etching process using the patterned mask PR1 acting as an etch mask. In some embodiments, the remaining portions the portions 130AB and the portions 130AP of the bottom electrode layer 130 in combination may be referred to as bottom electrodes 130A. In some embodiments, the bottom electrodes 130A are electrically connected to an underlying electrical components, such as transistors, through the metallization pattern 114.

The etching process to the bottom electrode layer 130 may be ion beam etching (IBE) with a power in a range of 100 to 2000 Volts, a beam angle of 0 to 70 degrees, and an etchant including at least one of He, Ne, Ar, Kr, and Xe. In some embodiments, the etching process may be inductively coupled plasma active-ion etching (ICP-RIE), with a power of transformer coupled plasma (TCP) in a range of 100 to 2000 watts, a bia voltage in a range of 0 to 500 Volts, and an etchant including at least one of $Cl_2$, $CF_3$, $CH_4$, Ar, $N_2$, $O_2$, $BCl_3$ and $SiCl_4$.

In some embodiments, a top portion of the dielectric layer 120 may also be removed by the etching process and recesses R1 are formed in the dielectric layer 120. As FIG. 4 shows, after the removal, each of the bottom electrodes 130A has a portion 130AP above the dielectric layer 120 and a portion 130AB embedded in the dielectric layer 120. The dielectric layer 120 has portions 122 protruding from a recessed top surface RS1 of the dielectric layer 120R, and the portions 122 surround the portions 130AB of the bottom electrodes 130A respectively. In some other embodiments, the etching process to the bottom electrode layer 130 may be performed until reaching the dielectric layer 120, and the dielectric layer 120 may not have protruding portions surrounding the bottom electrodes 130A.

Figure 5:
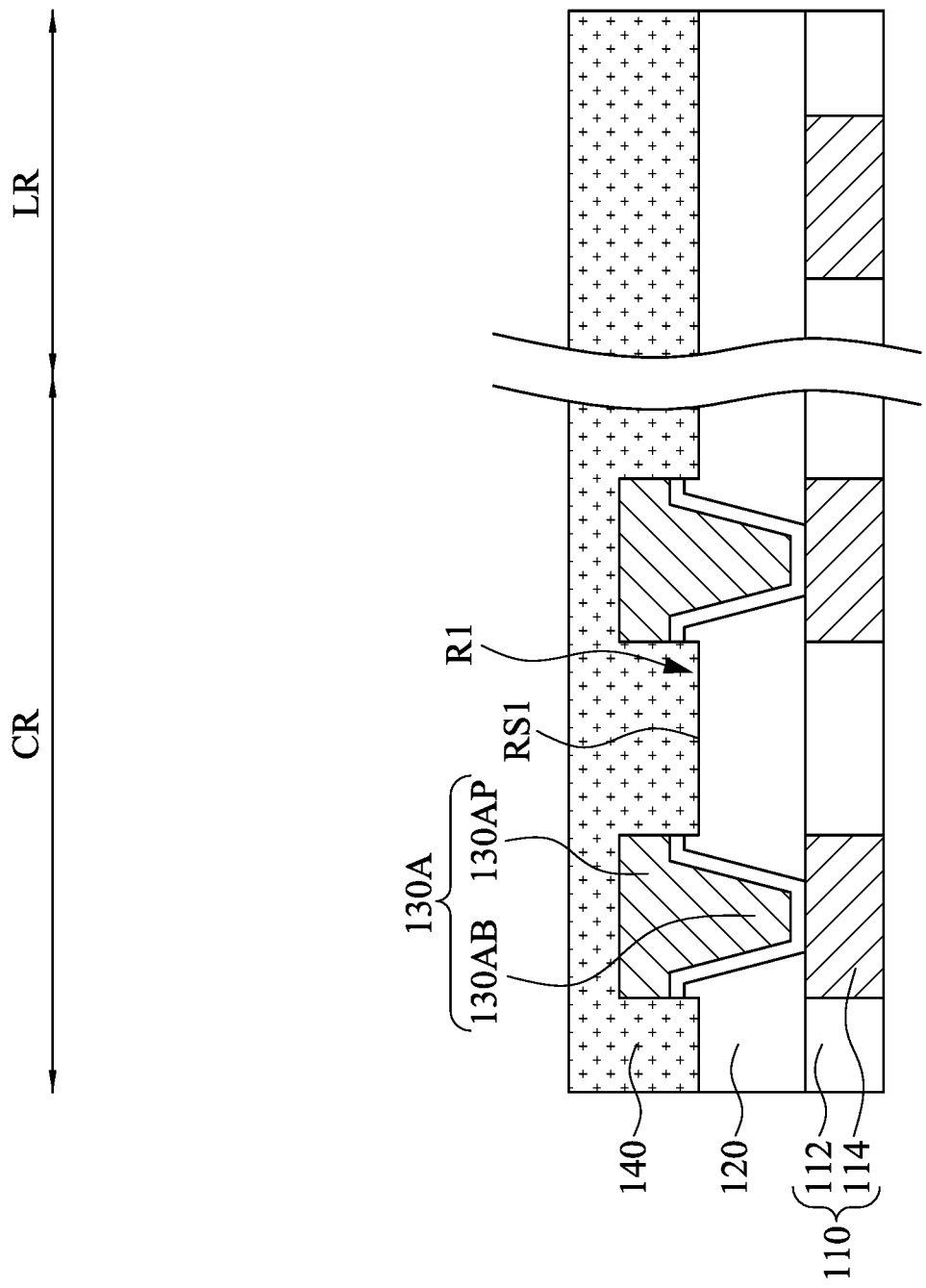

Reference is made to FIG. 5. An etch stop layer 140 is formed over the bottom electrodes 130A. The etch stop layer 140 covers and surrounds the bottom electrodes 130A. In some embodiments, the etch stop layer 140 fills the recesses R1 in the dielectric layer 120. The etch stop layer 140 may be an Al-based dielectric layer. For example, the etch stop layer 140 may be made of AlON, AlOx, or other suitable material. The etch stop layer 140 may be formed by acceptable deposition techniques, such as chemical vapor deposition (CVD), atomic layer deposition (ALD), the like, and/or a combination thereof. The etch stop layer 140 may be formed at a temperature ranging from 180 to 400 degrees Celsius. In some embodiments, a thickness of the etch stop layer 140 is higher than a height of the portion 130AP protruding from the recessed top surface RS1 of the dielectric layer 120, such that the etch stop layer 140 has a portion over the bottom electrodes 130A. Furthermore, in some embodiments, the thickness of the etch stop layer 140 is higher than a distance between the top surface of the bottom electrodes 130A and the recessed top surface RS1 of the dielectric layer 120. In some embodiments, the etch stop layer 140 may have a thickness in a range of 300 to 600 angstroms.

Figure 6:
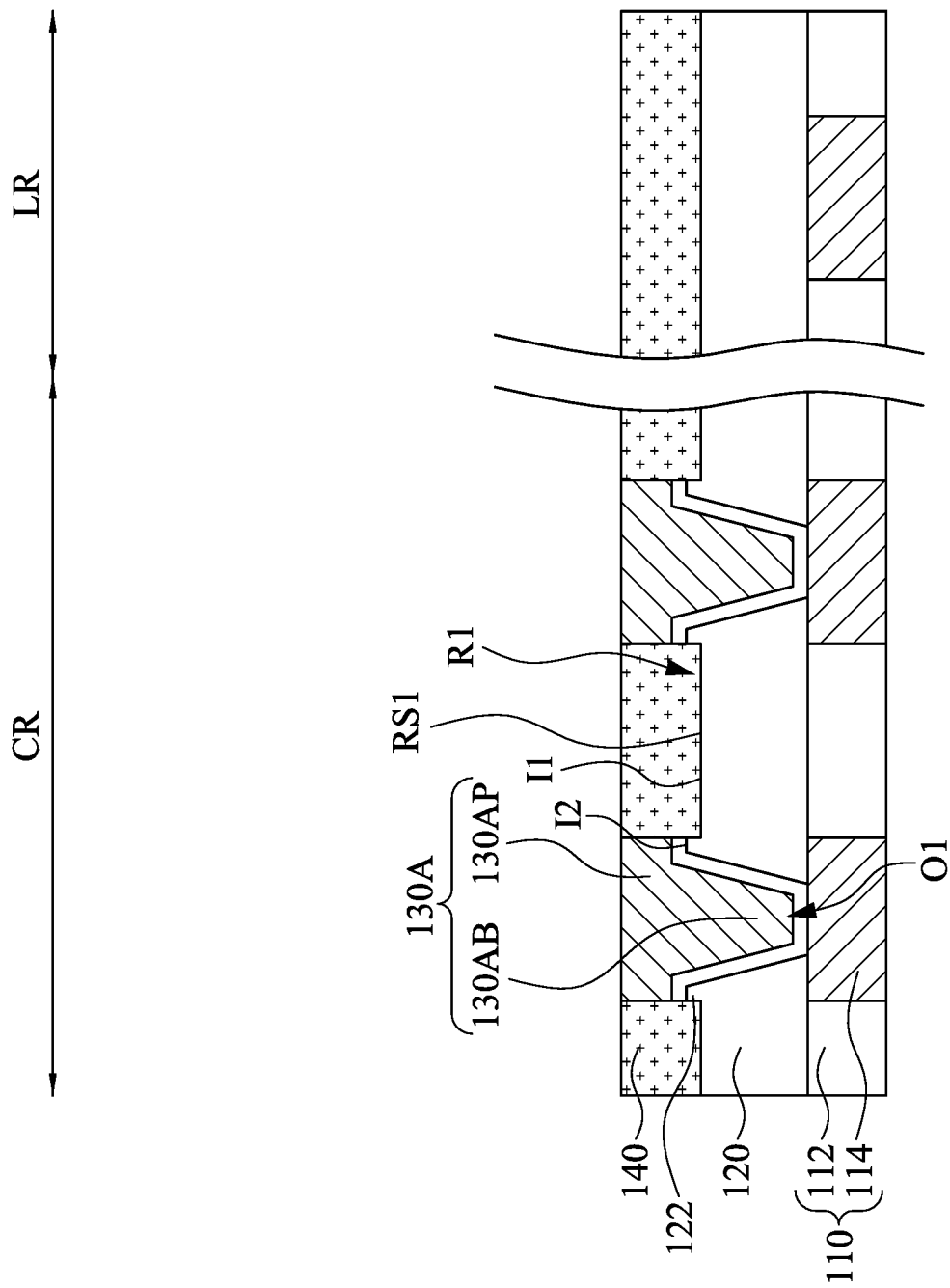

Reference is made to FIG. 6. A chemical-mechanical polish (CMP) process is performed to the etch stop layer 140 until reaching the bottom electrodes 130A, such that the bottom electrodes 130A are exposed. In some embodiments, the CMP process is stopped at reaching the bottom electrodes 130A. In some embodiments, the CMP process further removes a portion of the bottom electrodes 130A. After the CMP process, a top surface of the bottom electrodes 130A is leveled up with a top surface of the etch stop layer 140. Herein, each of the bottom electrodes 130A has the portion 130AP in the etch stop layer 14 and the portion 130AB embedded in the dielectric layer 120, and the portion 130AP and the portion 130AB have different shapes. In some embodiments, after the CMP process, the etch stop layer 140 and the portions 130AP of the bottom electrodes 130A outside the openings O1 have a thickness ranging from 100 to 400 angstroms.

As FIG. 6 shows, after the CMP process, the portion 130AP are in the etch stop layer 140. In some embodiments, the dielectric layer 120 may have the portions 122 protruding from the recessed top surface RS1 of the dielectric layer 120R, and the portions 122 may be at least partially in the etch stop layer 140. To be specific, a bottom of the etch stop layer 140 and the dielectric layer 120 forming a first interface I1, and the bottom electrode 130A and a top of the dielectric layer 120 form a second interface I2. The second interface I2 is at higher elevation than the first interface I1 from the substrate 110. The portions 122 of the dielectric layer 120 protrude from the first interface I1 and surround the bottom electrode 130A.

Figure 7:
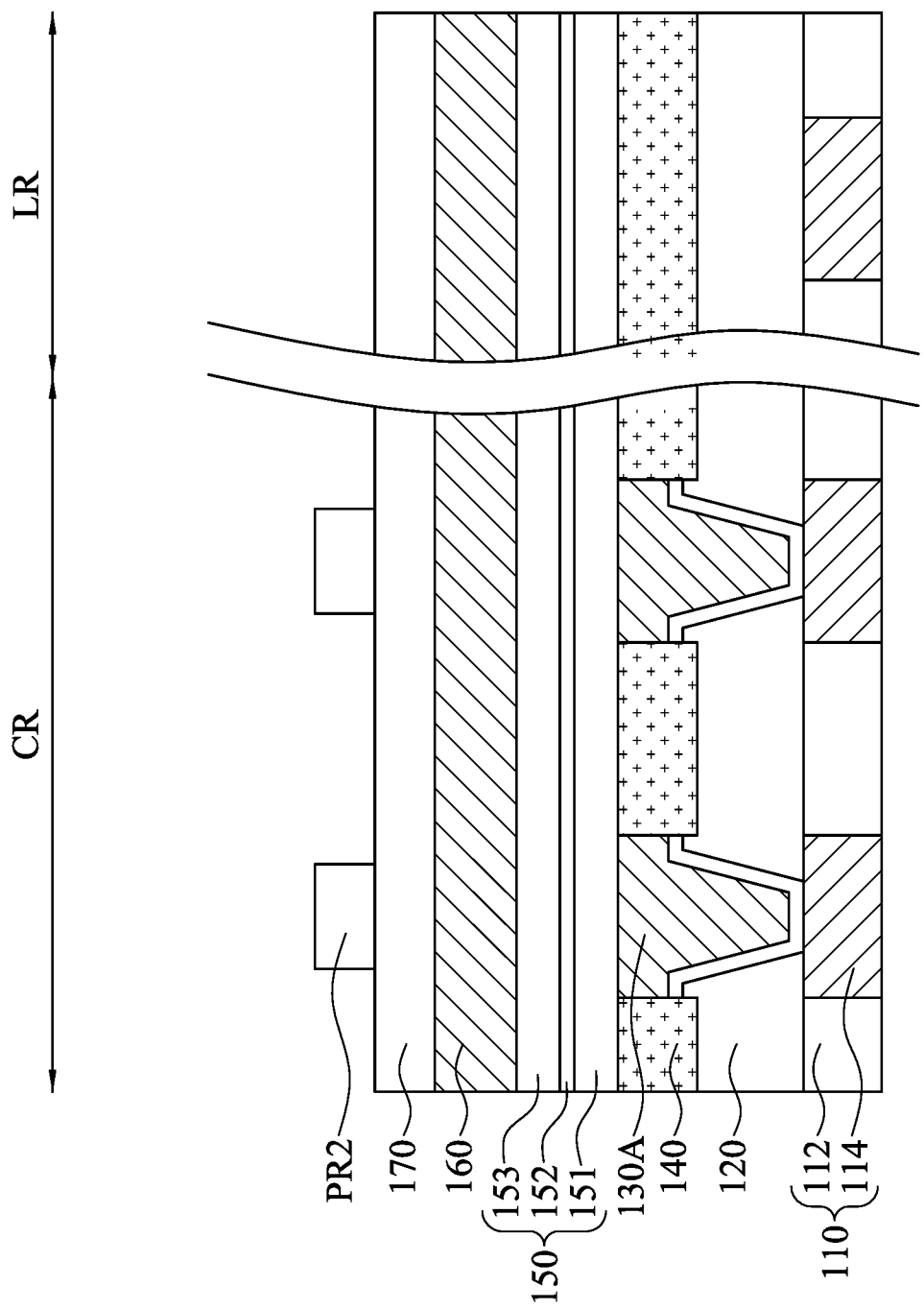

Reference is made to FIG. 7. A first magnetic layer 151, a tunnel barrier layer 152 and a second magnetic layer 153 are formed in sequence over the bottom electrodes 130A. The first and second magnetic layers 151, 153 and the tunnel barrier layer 152 therebetween collectively form a magnetic tunnel junction (MTJ) and are thus in combination referred to as an MTJ layer 150.

In some embodiments, the first magnetic layer 151 includes an anti-ferromagnetic material (AFM) layer over the bottom electrodes 130A and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), or iron manganese (FeMn). An exemplary formation method of the AFM layer includes sputtering, PVD, ALD or the like.

The ferromagnetic pinned layer in the first magnetic layer 151 forms a permanent magnet and exhibits strong interactions with magnets. A direction of a magnetic moment of the ferromagnetic pinned layer can be pinned by an anti-ferromagnetic material (AFM) layer and is not changed during operation of a resulting MTJ stack fabricated from the MTJ layer 150. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD or ALD. In some embodiments, the ferromagnetic pinned layer includes a multilayer structure.

The tunnel barrier layer 152 is formed over the first magnetic layer 151. The tunnel barrier layer 152 can also be referred to as a tunneling layer, which is thin enough that electrons are able to tunnel through the tunnel barrier layer when a biasing voltage is applied to a resulting MTJ stack fabricated from the MTJ layer 150. In certain embodiments, the tunnel barrier layer 152 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 152 includes sputtering, PVD, ALD or the like.

The second magnetic layer 153 is formed over the tunnel barrier layer 152. The second magnetic layer 153 is a ferromagnetic free layer in some embodiments. A direction of a magnetic moment of the second magnetic layer 153 is not pinned because there is no anti-ferromagnetic material in the second magnetic layer 153. Therefore, the magnetic orientation of this layer is adjustable, thus the layer is referred to as a free layer. In some embodiments, the direction of the magnetic moment of the second magnetic layer 153 is free to rotate parallel or anti-parallel to the pinned direction of the magnetic moment of the ferromagnetic pinned layer in the first magnetic layer 151. The second magnetic layer 153 may include a ferromagnetic material similar to the material in the ferromagnetic pinned layer in the first magnetic layer 151. Since the second magnetic layer 153 has no anti-ferromagnetic material while the first magnetic layer 151 has an anti-ferromagnetic material therein, the first and second magnetic layers 151 and 153 have different materials. In certain embodiments, the second magnetic layer 153 includes cobalt, nickel, iron or boron. An exemplary formation method of the second magnetic layer 153 includes sputtering, PVD, ALD or the like.

A top electrode layer 160 is formed over the MTJ layer 150. The top electrode layer 160 includes a conductive material. In some embodiments, the top electrode layer 160 is similar to the bottom electrode layer 140 in terms of composition. In some embodiments, the top electrode layer 160 comprises titanium (Ti), tantalum (Ta), platinum (Pt), ruthenium (Ru), tungsten (W), aluminum (Al), copper (Cu), the like or combinations thereof. An exemplary formation method of the top electrode layer 160 includes sputtering, PVD, ALD or the like.

A hard mask layer 170 is formed over the top electrode layer 160. In some embodiments, the hard mask layer 170 is formed from a dielectric material. For example, the hard mask layer 170 may be silicon carbide (SiC), silicon oxynitride (SiON), silicon nitride (SiN), silicon dioxide ($SiO_2$), the like, and/or combinations thereof. The hard mask layer 170 may be formed by acceptable deposition techniques, such as CVD, ALD, PVD, the like, and/or combinations thereof.

A resist layer is formed over the hard mask layer 170 and then patterned into a patterned resist mask PR2 using a suitable photolithography process, such that portions of the hard mask layer 170 are exposed by the patterned resist mask PR2. In some embodiments, the patterned resist mask PR2 is a photoresist. In some embodiments, the patterned resist mask PR2 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 8:
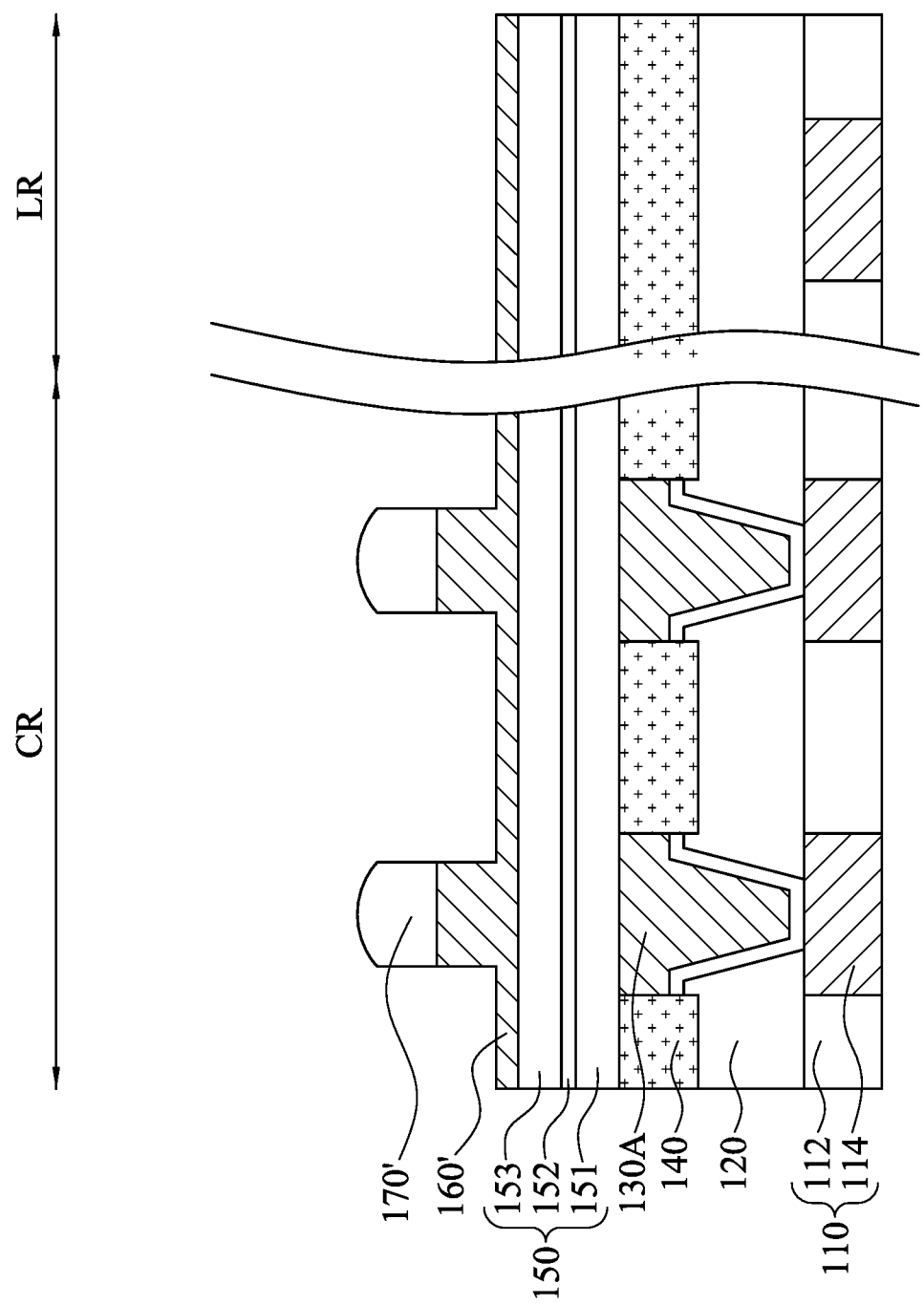

Reference is then made to FIG. 8. Portions of the hard mask layer 170 and underlying top electrode layer 160 not protected by the patterned resist mask PR2 are removed. The hard mask layer 170 and underlying top electrode layer 160 may be etched using acceptable etching techniques, such as by using an anisotropic etching process. After removing portions of the hard mask layer 170 and underlying top electrode layer 160 disposed beyond the patterned resist mask PR2, a top electrode layer 160' having a hard mask cover 170' remain as shown in FIG. 8.

In some embodiments, a portion of the mask layer 170 is consumed during the etching process and a remaining patterned mask layer 170 is left as the hard mask cover 170' for the following processes. Due to the consuming, the hard mask cover 170' is thinner than the hard mask layer 170 before the etching process. The patterned resist mask PR2 is removed using, for example, an ash process, after the etching process.

The etching process stops before reaching the MTJ layer 150. For example, the etching process does not etch through the top electrode layer 160, and hence the second magnetic layer 153 remains covered by the top electrode layer 160'. The stopping of the etching process can be controlled by the etching duration time, as examples. As illustrated in FIG. 8, after the etching process, a portion of the top electrode layer 160' is covered by the hard mask cover 170', and another portion of the top electrode layer 160' is exposed by the hard mask cover 170'. Herein, the portion of the top electrode layer 160' exposed by the hard mask cover 170' may have a thickness ranging from 100 to 200 angstroms.

Figure 9:
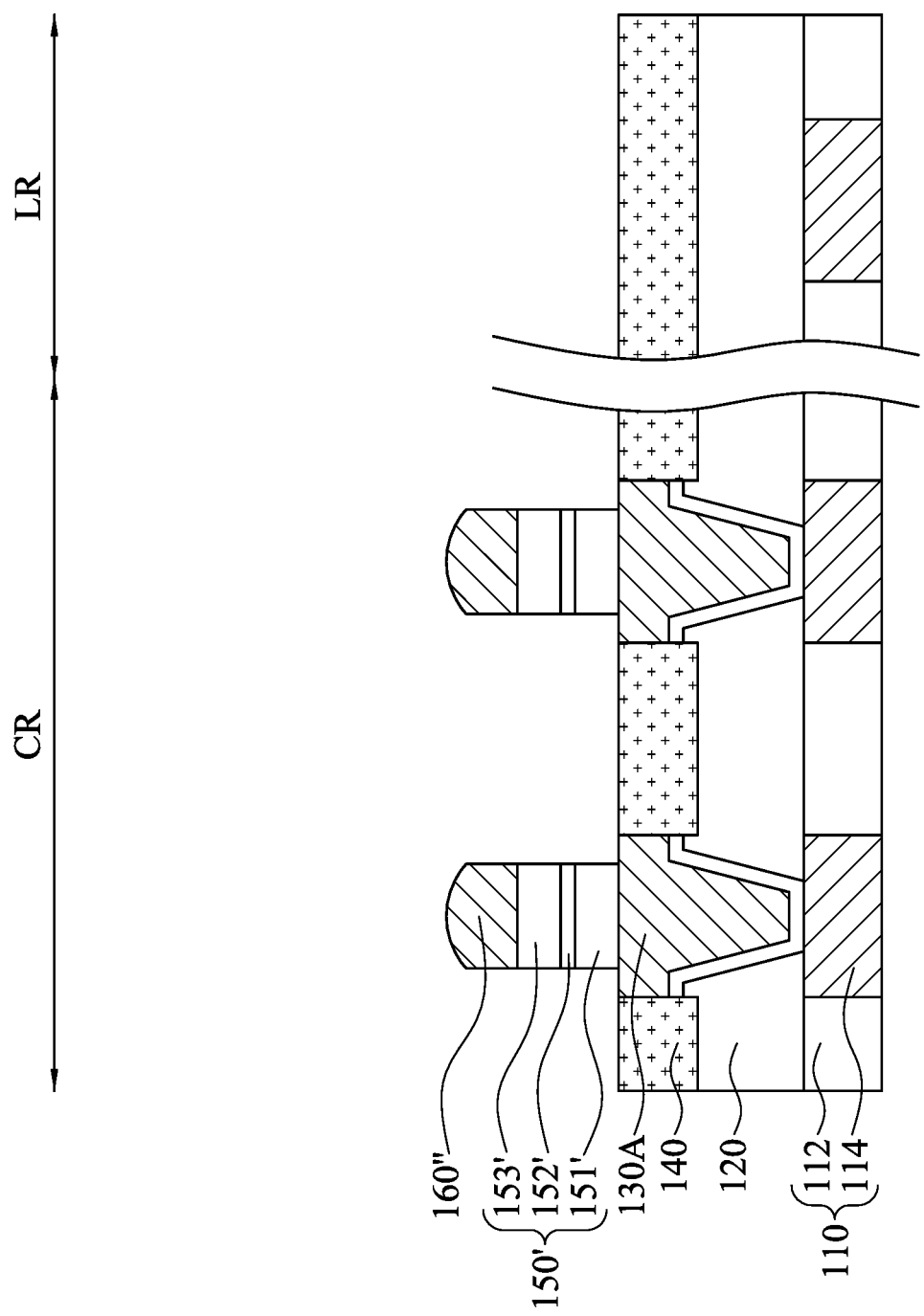

Reference is then made to FIG. 9. Exposed portions of the top electrode layer 160' and underlying MTJ layer 150 not protected by the hard mask cover 170' are removed. The removal may include plural etching process. In some embodiments, the etch stop layer 140 has a higher etch resistance to the etching process than that of the bottom electrode 130A, the top electrode layer 160', and the MTJ layer 150. For example, the removal may include a first etching process to the top electrode layer 160' and the second magnetic layer 153 and a second etching process to the tunnel barrier layer 152 and the first magnetic layer 151. The etch stop layer 140 may have a higher etch resistance to the first etching process than that of the top electrode layer 160' and the second magnetic layer 153, and have a higher etch resistance to the second etching process than that of tunnel barrier layer 152 and the first magnetic layer 151.

The first etching process may be an anisotropic etching process. After removing portions of the top electrode layer 160' and underlying second magnetic layer 153 disposed beyond the hard mask cover 170', a second magnetic layer 153' and an overlying top electrode 160'' remain. In some embodiments, the tunnel barrier layer 152 and the overlying second magnetic layer 153 have different etch resistance properties. For example, the tunnel barrier layer 152 is made of a material (e.g. MgO) which has higher etch resistance to an etchant used in the first etching process than that of the second magnetic layer 153. Therefore, the first etching process can be slowed down or even stopped by the tunnel barrier layer 152. As a result, the first etching process can stop at a top surface of the tunnel barrier layer 152. An exemplary first etching process includes a dry etch or a combination of dry etch and wet etch. The dry etching process may use fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In the first etching process, the hard mask cover 170' acts as an etch mask that protects underlying materials from the etching process.

In some embodiments, exposed portions of the tunnel barrier layer 152 and underlying first magnetic layer 151 are etched by the second etching process. An second etching process is performed to remove exposed portions of the tunnel barrier layer 152 and underlying first magnetic layer 151 not protected by the top electrode 160'' and the hard mask cover 170'. The tunnel barrier layer 152 and underlying first magnetic layer 151 may be etched using acceptable etching techniques, such as by using an anisotropic etching process. After removing portions of the tunnel barrier layer 152 and underlying first magnetic layer 151 disposed beyond the top electrode 160'' and hard mask cover 170', a tunnel barrier layer 152' and a first magnetic layer 151' remain as shown in FIG. 9. The first magnetic layer 151', the tunnel barrier layer 152' and the second magnetic layer 153' are in combination referred to as an MTJ stack or structure 150'.

An exemplary second etching process includes a dry etch or a combination of dry etch and wet etch. The dry etching process may use fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In the second etching process, the hard mask cover 170' act as an etch mask that protects underlying materials from the second etching process, such that widths of the tunnel barrier layer 152' and of the first magnetic layer 151' can be determined by the hard mask cover 170'. In some embodiments, the second etching process to the tunnel barrier layer 152 and the first magnetic layer 151 and the previously performed first etching process to the top electrode layer 160' and the second magnetic layer 153 use substantially the same etchant. In other embodiments, the second etching process and the previously performed first etching process use different etchants. The hard mask cover 170' may be removed during or after the etching process.

In some embodiments, the etching process to the MTJ layer 150 may be ion beam etching (IBE) with a power in a range of 100 to 2000 Volts, a beam angle of 0 to 70 degrees, and an etchant including at least one of He, Ne, Ar, Kr, and Xe. In some embodiments, the etching process may be inductively coupled plasma active-ion etching (ICP-RIE), with a power of transformer coupled plasma (TCP) in a range of 100 to 2000 watts, a bia voltage in a range of 0 to 800 Volts, and an etchant such as $CH_3COOH$, $CH_3OH$, and $CH_3CH_2OH$ or other suitable organic gas.

Figure 10:
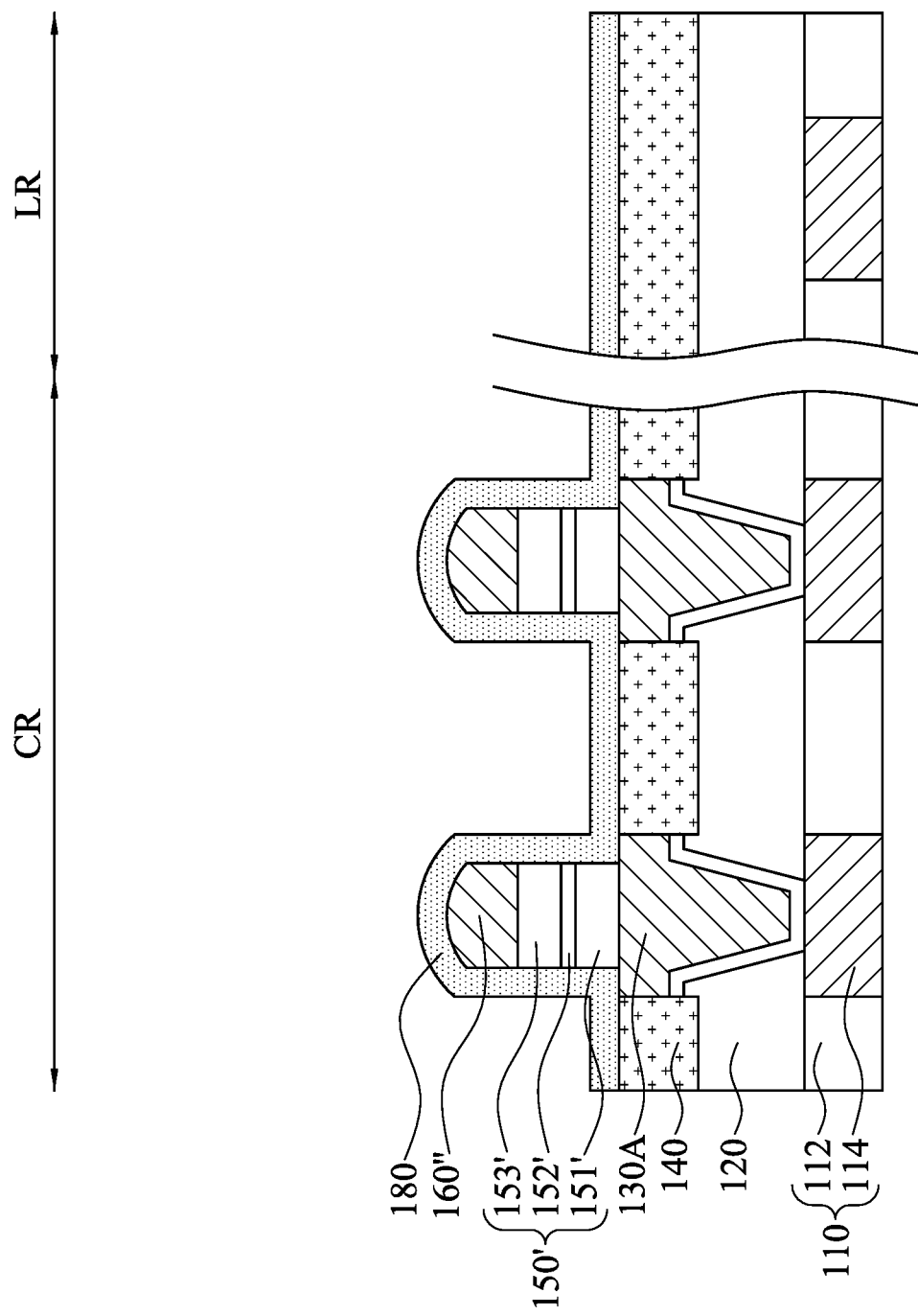

Reference is then made to FIG. 10. A first spacer layer 180 is blanket formed over the structure 150', the top electrodes 160'', and the etch stop layer 140. The first spacer layer 180 in some embodiments may include SiN, but in other embodiments may include SiC, SiON, silicon oxycarbide (SiOC), the like, and/or combinations thereof. The first spacer layer 180 may be formed using CVD, PVD, ALD, PECVD (plasma-enhanced CVD), the like, and/or combinations thereof. The first spacer layer 180 may have thickness in a range of 50 to 250 angstroms.

Figure 11:
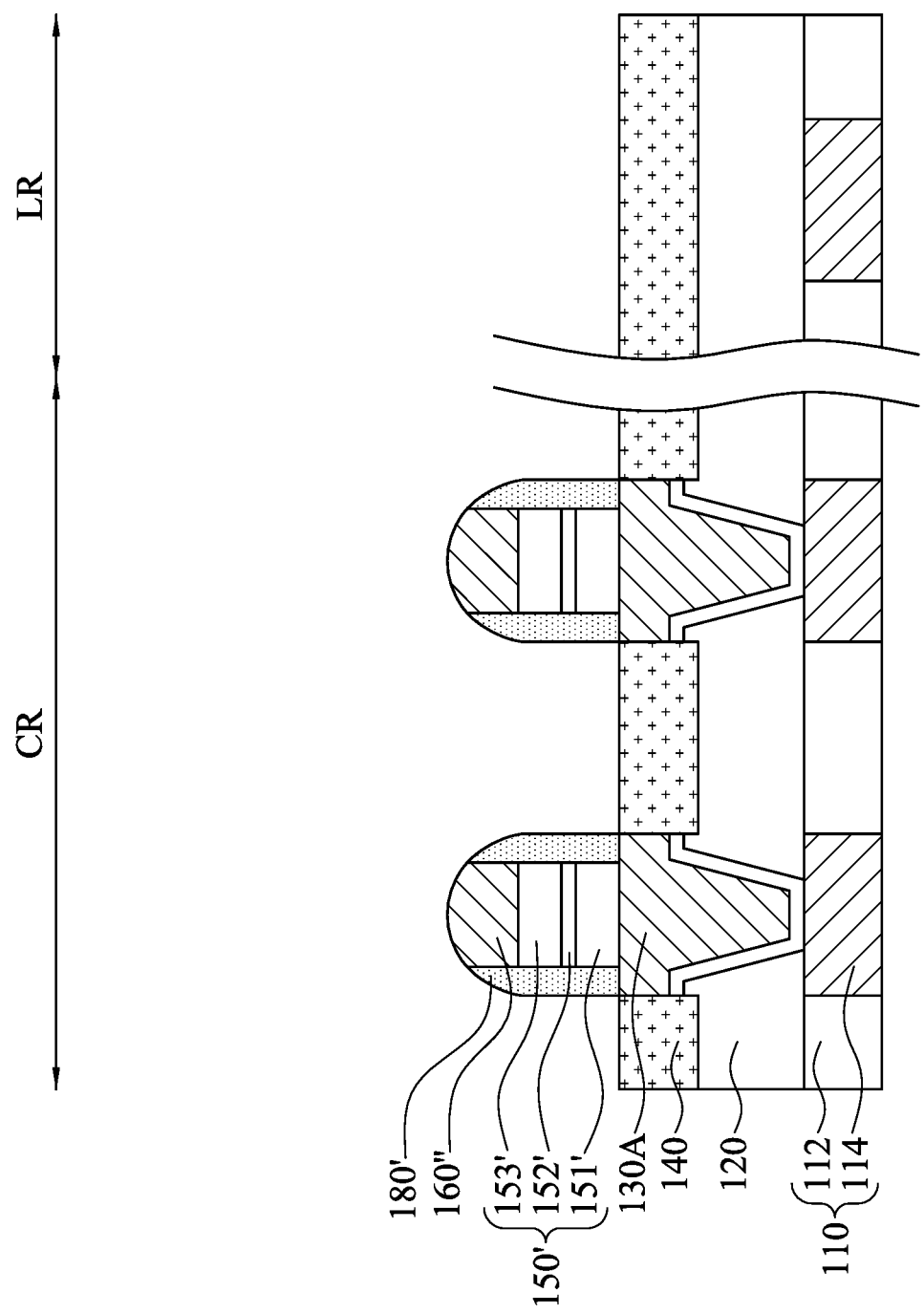

Reference is then made to FIG. 11. The first spacer layer 180 is etched into at least one first spacer 180' covering sidewalls of the structure 150'. The etching process may be an anisotropic etch back process. The etch stop layer 140 has a higher etch resistance to the etching process than that of the first spacer layer 180. After the etching process, the top electrodes 160'' are exposed.

Figure 12:
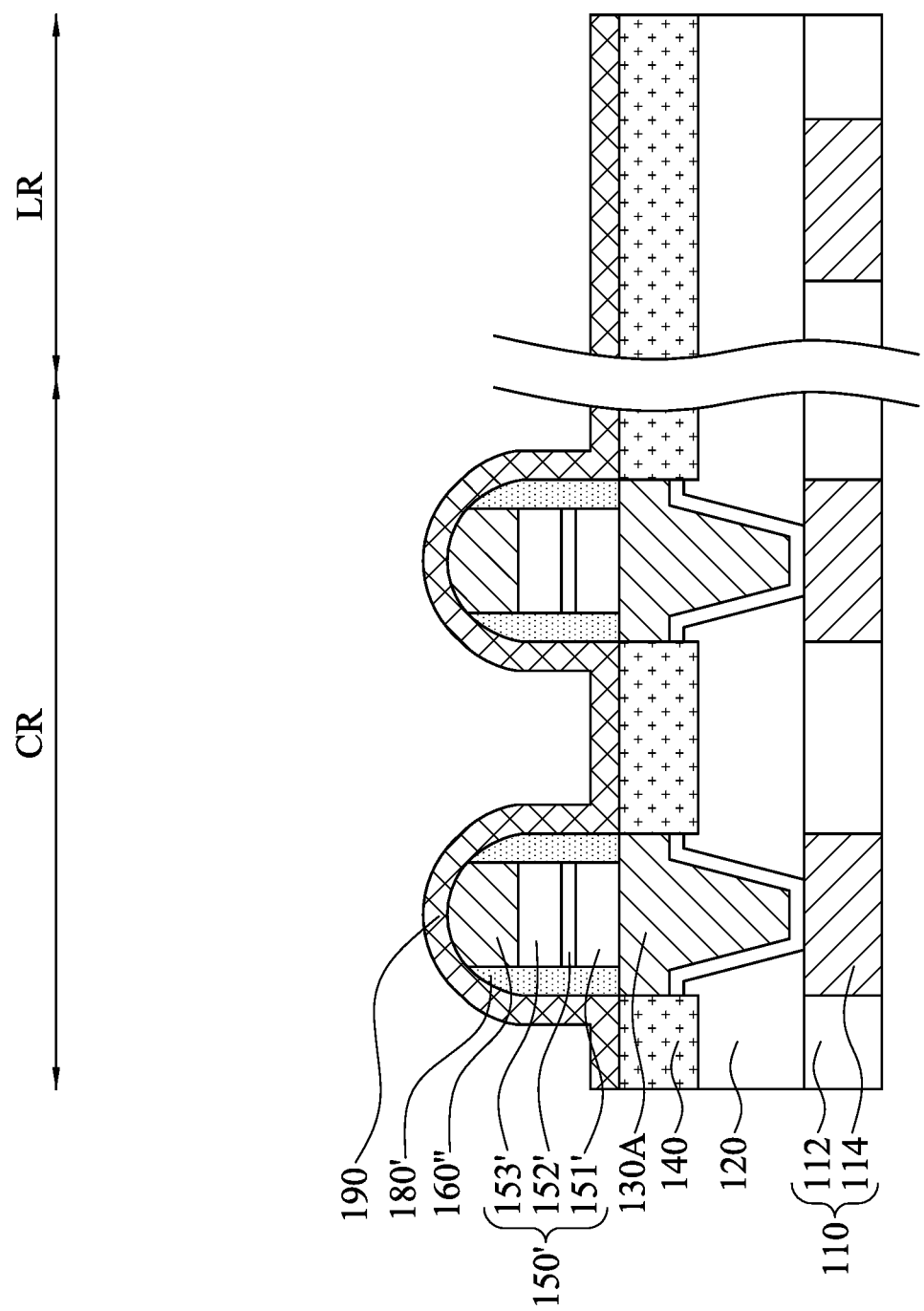

Reference is then made to FIG. 12. A second spacer layer 190 is blanket formed over the structure 150', the top electrodes 160'', and the etch stop layer 140, and the second spacer layer 19 surrounds the first spacers 180'. The second spacer layer 190 in some embodiments may include SiN, but in other embodiments may include SiC, SiON, silicon oxycarbide (SiOC), the like, and/or combinations thereof. The second spacer layer 190 may be formed using CVD, PVD, ALD, PECVD (plasma-enhanced CVD), the like, and/or combinations thereof. The second spacer layer 190 may have a thickness in a range of 50 to 250 angstroms.

Figure 13:
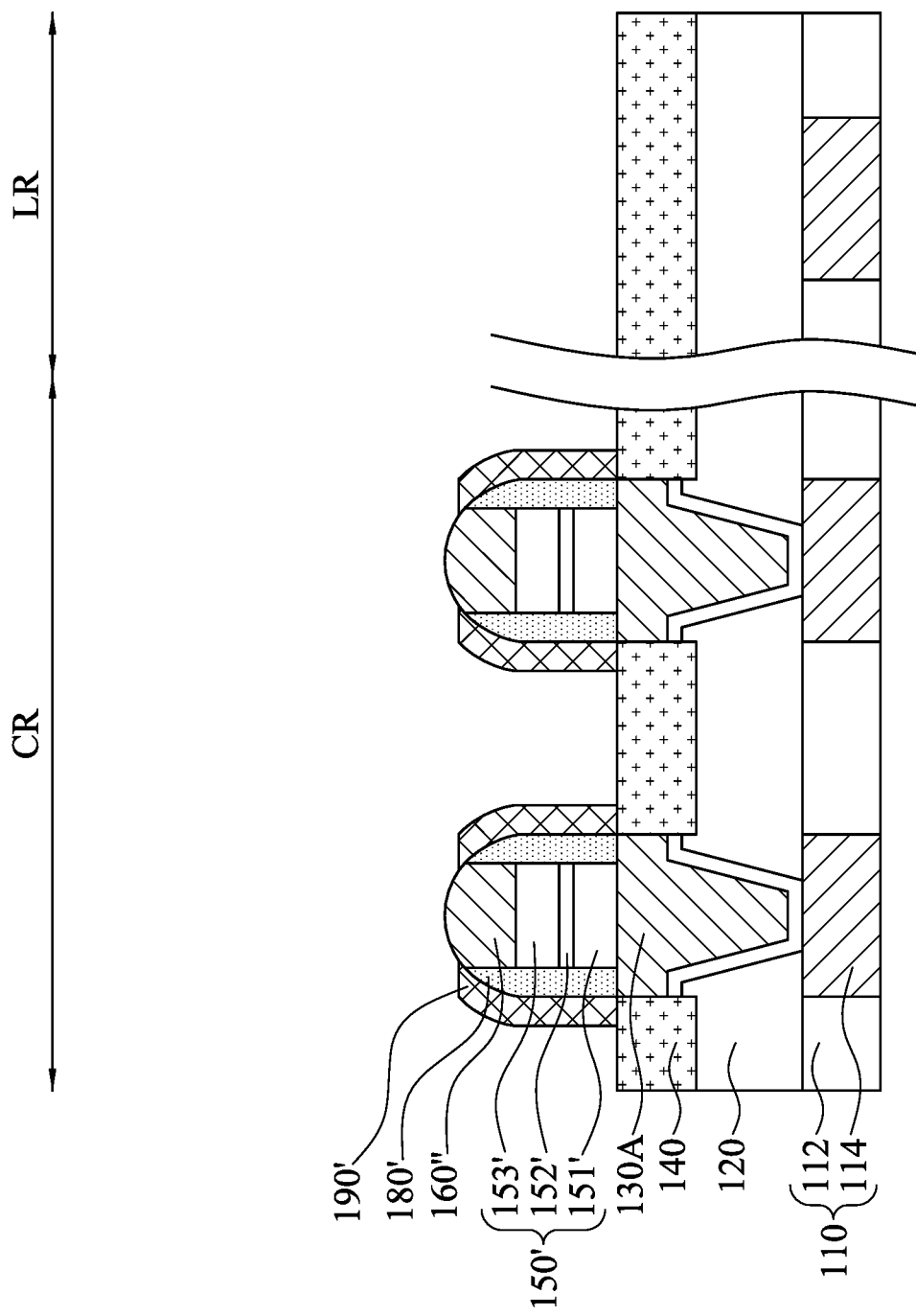

Reference is then made to FIG. 13. The second spacer layer 190 is etched into at least one second spacer 190'. The etching process may be an anisotropic etch back process. The etch stop layer 140 has a higher etch resistance to the etching process than that of the second spacer layer 190. The second spacers 190' are in contact with sidewalls of the first spacers 180' respectively. In some embodiments, the second spacers 190' are formed around and enclose the first spacers 180' respectively. In other embodiments, separate second spacers 190' may not fully enclose the first spacers 180'. In some embodiments, a density of the second spacers 190' may be higher than that of the first spacer 180'. After the etching process, the top electrode 160" is exposed.

Figure 14:
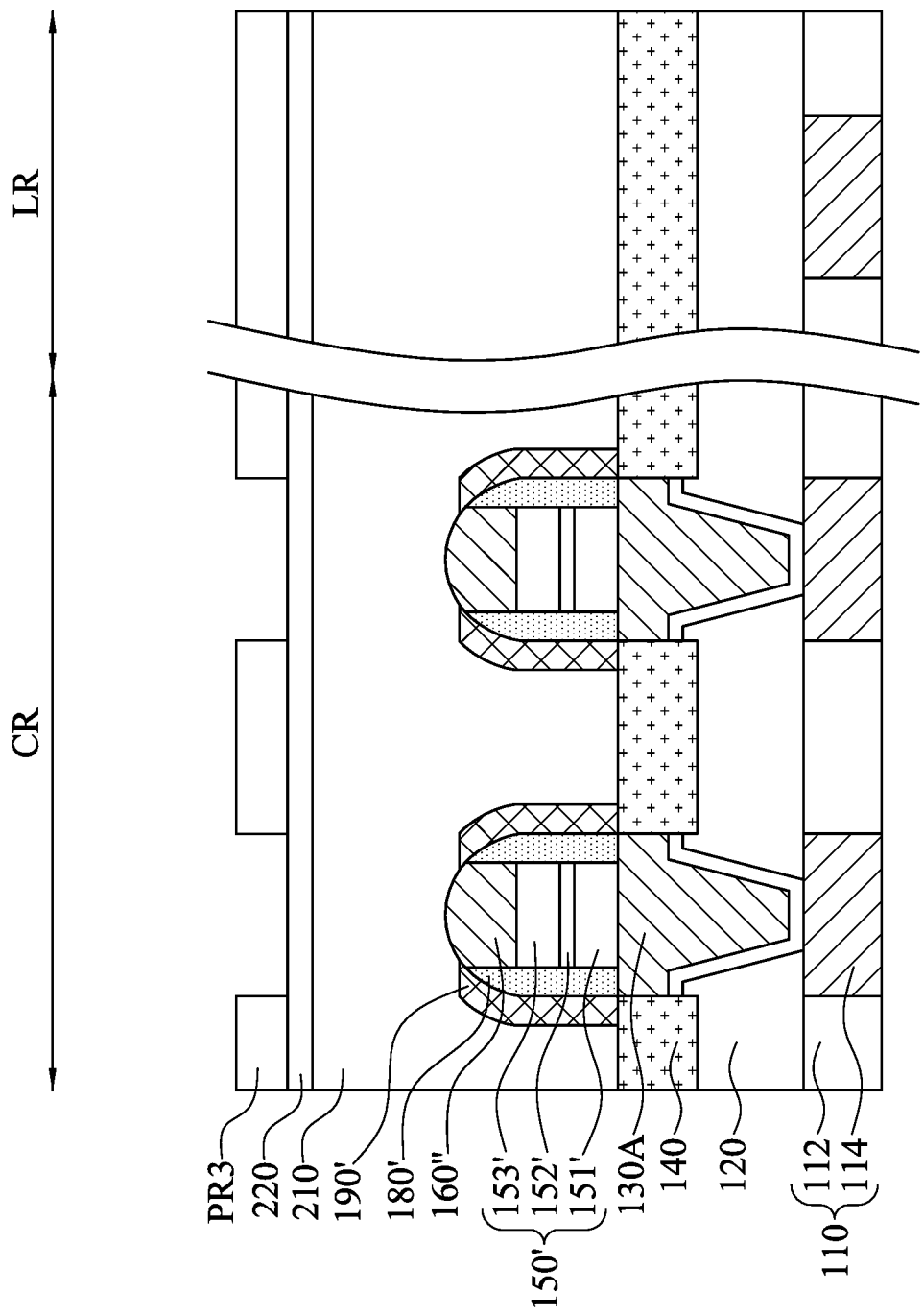

Reference is then made to FIG. 14. An ILD layer 210 is formed over the substrate 110. In some embodiments, the ILD layer 210 may have the same material as the ILD layer 112. In some other embodiments, the ILD layer 210 may have a different material than the ILD layer 112. In some embodiments, the ILD layer 210 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

A hard mask layer 220 is formed over the ILD layer 210. In some embodiments, the hard mask layer 220 is formed from a dielectric material. For example, the hard mask layer 170 may be silicon carbide (SiC), silicon oxynitride (SiON), silicon nitride (SiN), silicon dioxide ($SiO_2$), the like, and/or combinations thereof. The hard mask layer 220 may be formed by acceptable deposition techniques, such as CVD, ALD, PVD, the like, and/or combinations thereof.

A resist layer is formed over the hard mask layer 220 and then patterned into a patterned resist mask PR3 using a suitable photolithography process, such that portions of the hard mask layer 220 are exposed by the patterned resist mask PR3. In some embodiments, the patterned resist mask PR3 is a photoresist. In some embodiments, the patterned resist mask PR3 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 15:
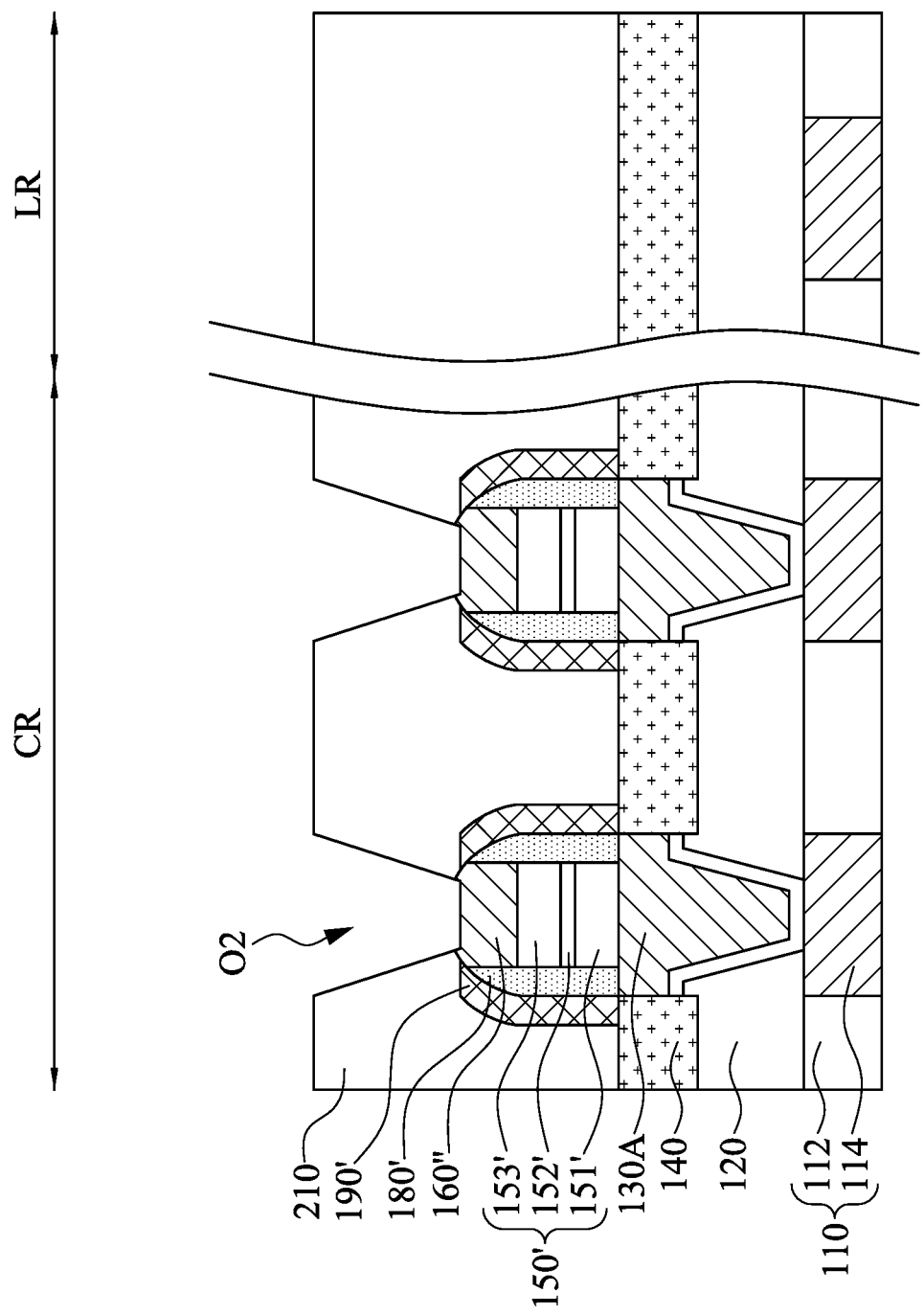

Reference is then made to FIG. 15. Portions of the hard mask layer 220 and underlying ILD layer 210 not protected by the patterned resist mask PR3 are removed, and trenches and via openings O2 are formed in the ILD layer 210 to expose the top electrodes 160". The hard mask layer 220 and underlying ILD layer 210 may be etched using acceptable etching techniques, such as by using an anisotropic etching process. The patterned resist mask PR3 may be removed using, for example, an ash process, after the etching process.

Figure 16:
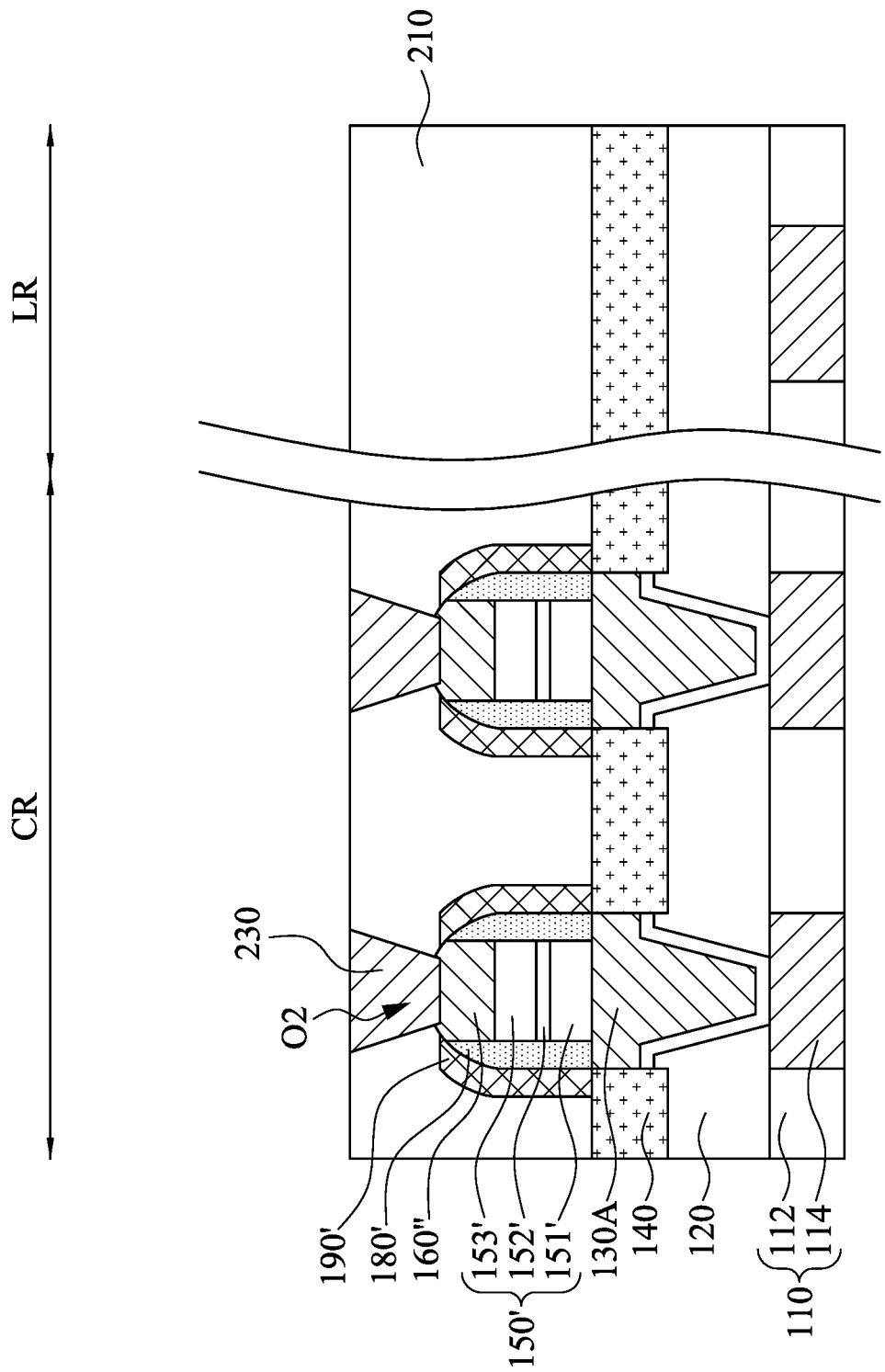

Reference is then made to FIG. 16. One or more conductive materials (e.g., copper) fill in the opening O2 to form the upper metallization pattern 230, so that the upper metallization pattern 230 can reach on the top electrodes 160". In some embodiments, the opening O2 and the metallization pattern 230 may be formed by a dual-damascene process. A planarization process, such as CMP, is then performed to remove excesses portion of the conductive material.

Figure 17:
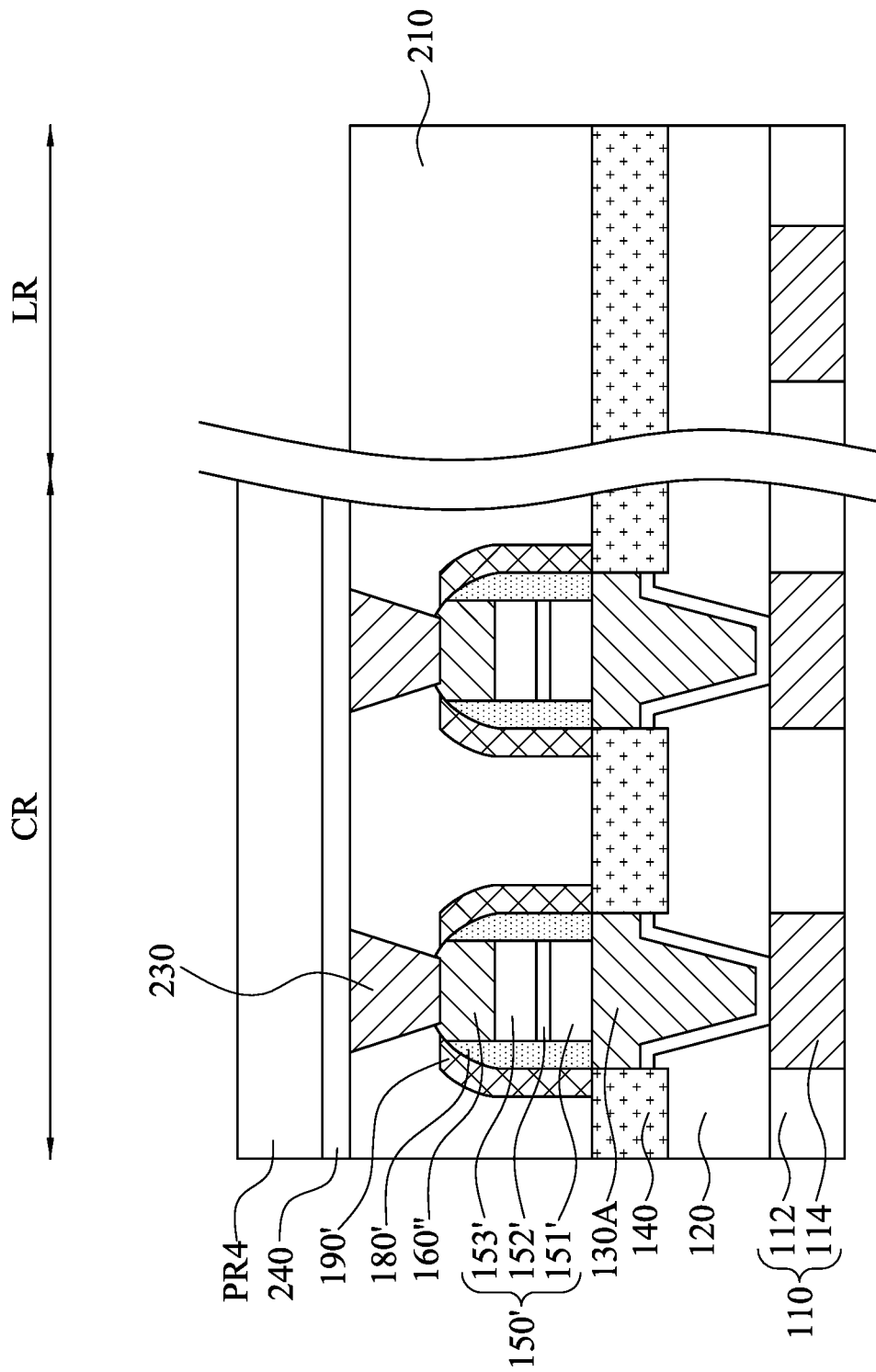

Reference is then made to FIG. 17. A resist layer and a hard mask layer are formed over a portion of the ILD layer 210 in the memory region CR and not over the logic region LR. The resist layer is patterned into a patterned resist mask PR4 using a suitable photolithography process. A portion of the hard mask layer is etched through the patterned resist mask PR4 and a remaining portion of the hard mask layer covered by the patterned resist mask PR2 remains. The remaining portion pf the hard mask layer is referred to the hard mask 240. The patterned resist mask PR4 may be removed using, for example, an ash process, after the etching process.

In some embodiments, the patterned resist mask PR4 is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

The hard mask 240 may be silicon carbide (SiC), silicon oxynitride (SiON), silicon nitride (SiN), silicon dioxide ($SiO_2$), the like, and/or combinations thereof. The hard mask layer 240 may be formed by acceptable deposition techniques, such as CVD, ALD, PVD, the like, and/or combinations thereof. In some embodiments, the hard mask 240 may be a protection layer protecting the metallization pattern 230 and the ILD layer 210 during the ash process to the resist mask PR4.

Figure 18:
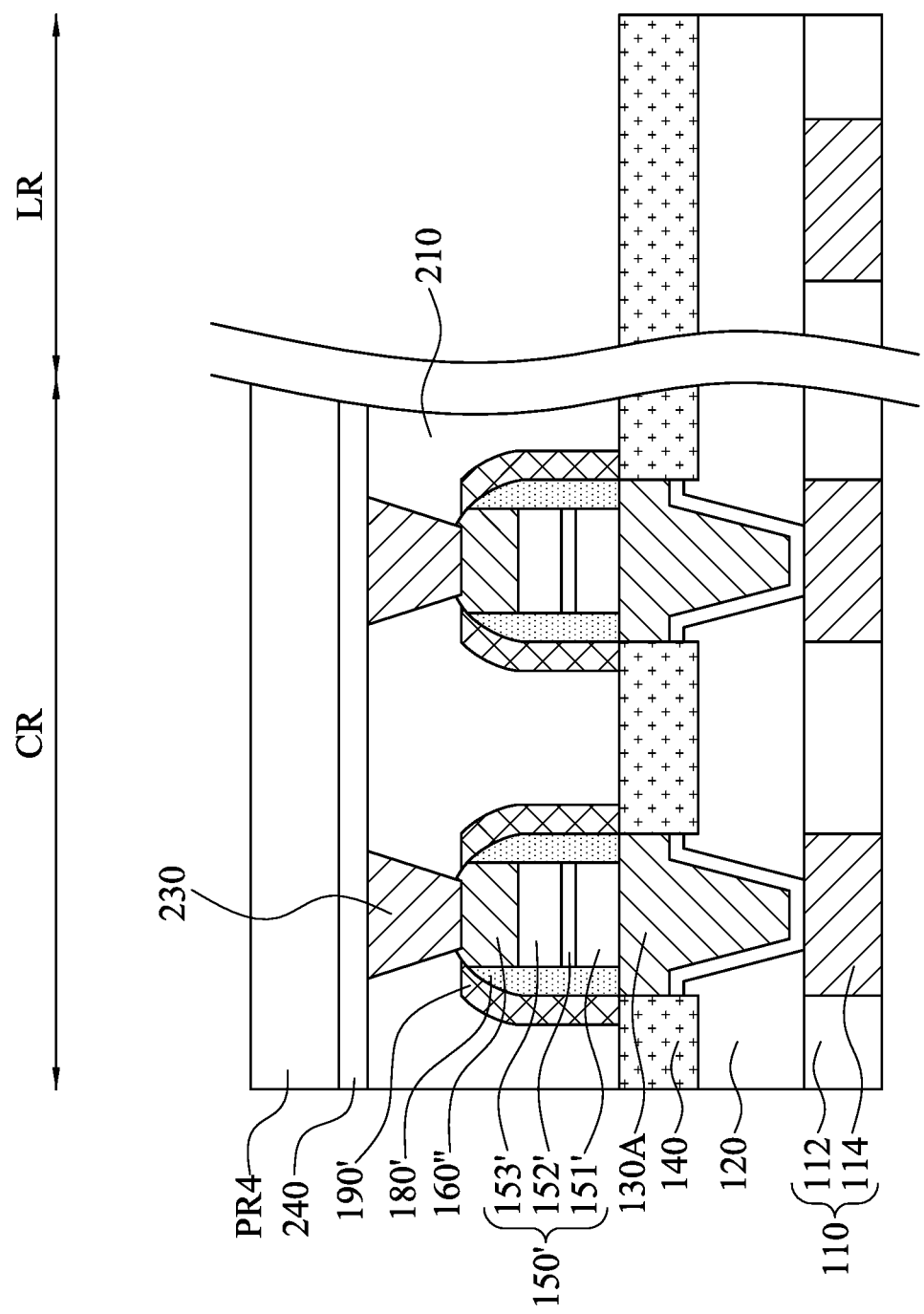
Figure 20:
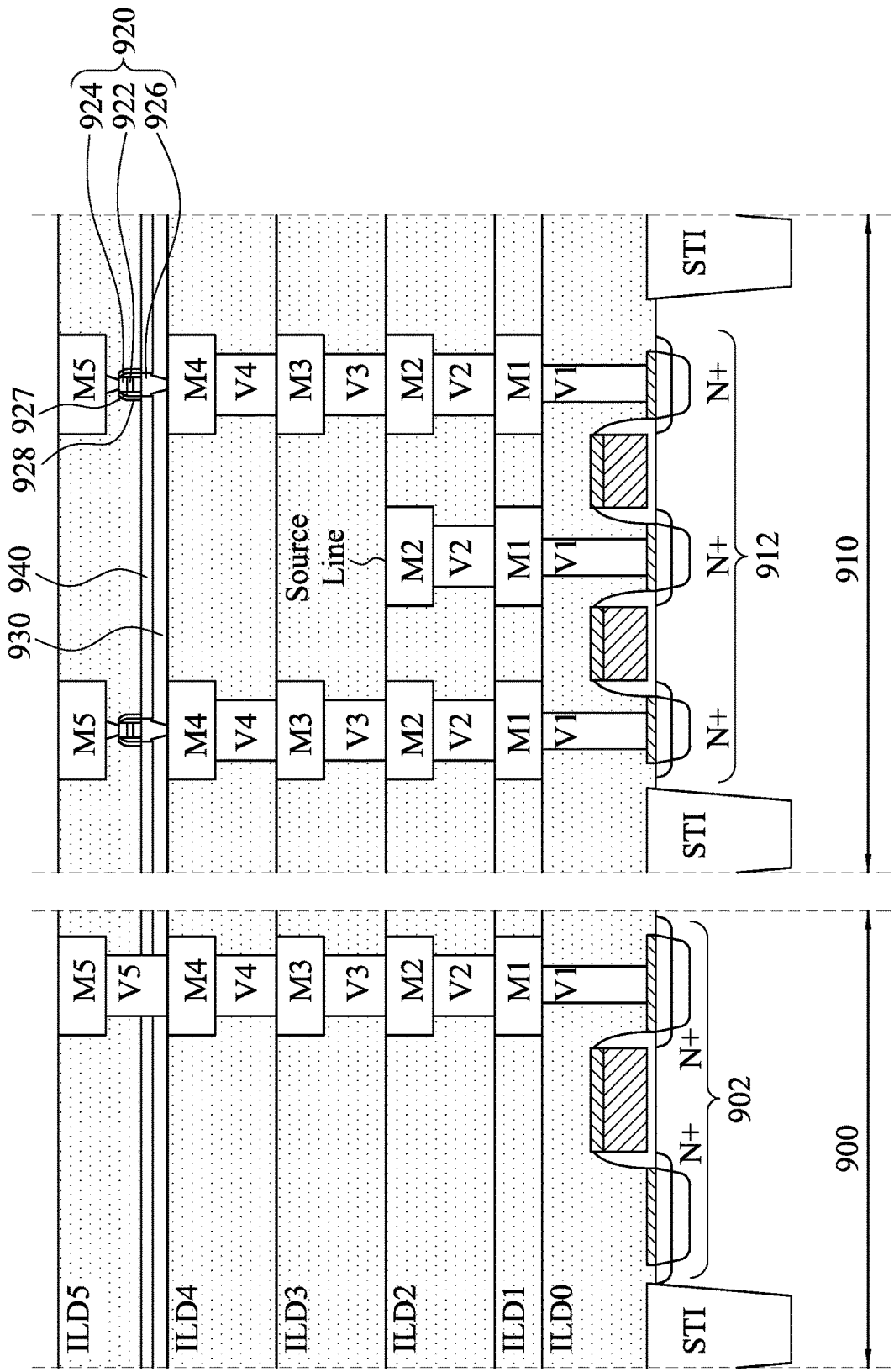
FIG. 20 illustrates an integrated circuit including MRAM devices and logic devices.

Reference is then made to FIG. 18. The portion of the ILD layer 210 in the logic region LR is removed. For example, the portion of the ILD layer 210 over a logic transistor (e.g. logic transistor 902 as shown in FIG. 20) is removed. Herein, an etching process using the hard mask 240 as an etching mask is performed to the ILD layer 210. The etch stop layer 140 has a higher etch resistance to the etching process than that of the ILD layer 210, such that the etching process stops at the top surface of the etch stop layer 140, and the etch stop layer 140 is exposed. Through the configuration, the dielectric layers (e.g., the ILD layer 210) in the logic region LR over the etch stop layer 140 may be fully removed.

The etching process may be ion beam etching (IBE) with a power in a range of 100 to 1500 Volts, a beam angle of 0 to 70 degrees, and an etchant including at least one of He, Ne, Ar, Kr, and Xe. In some embodiments, the etching process may be inductively coupled plasma active-ion etching (ICP-RIE), with a power of transformer coupled plasma (TCP) in a range of 100 to 2000 watts, a bia voltage in a range of 0 to 500 Volts, and an etchant such as $CF_4$, $CHF_3$, $CH_3F$, $CH_2F_2$, $C_4F_8$, $C_4F_6$, $N_2$, $O_2$ and Ar, or other suitable gas.

Figure 19:
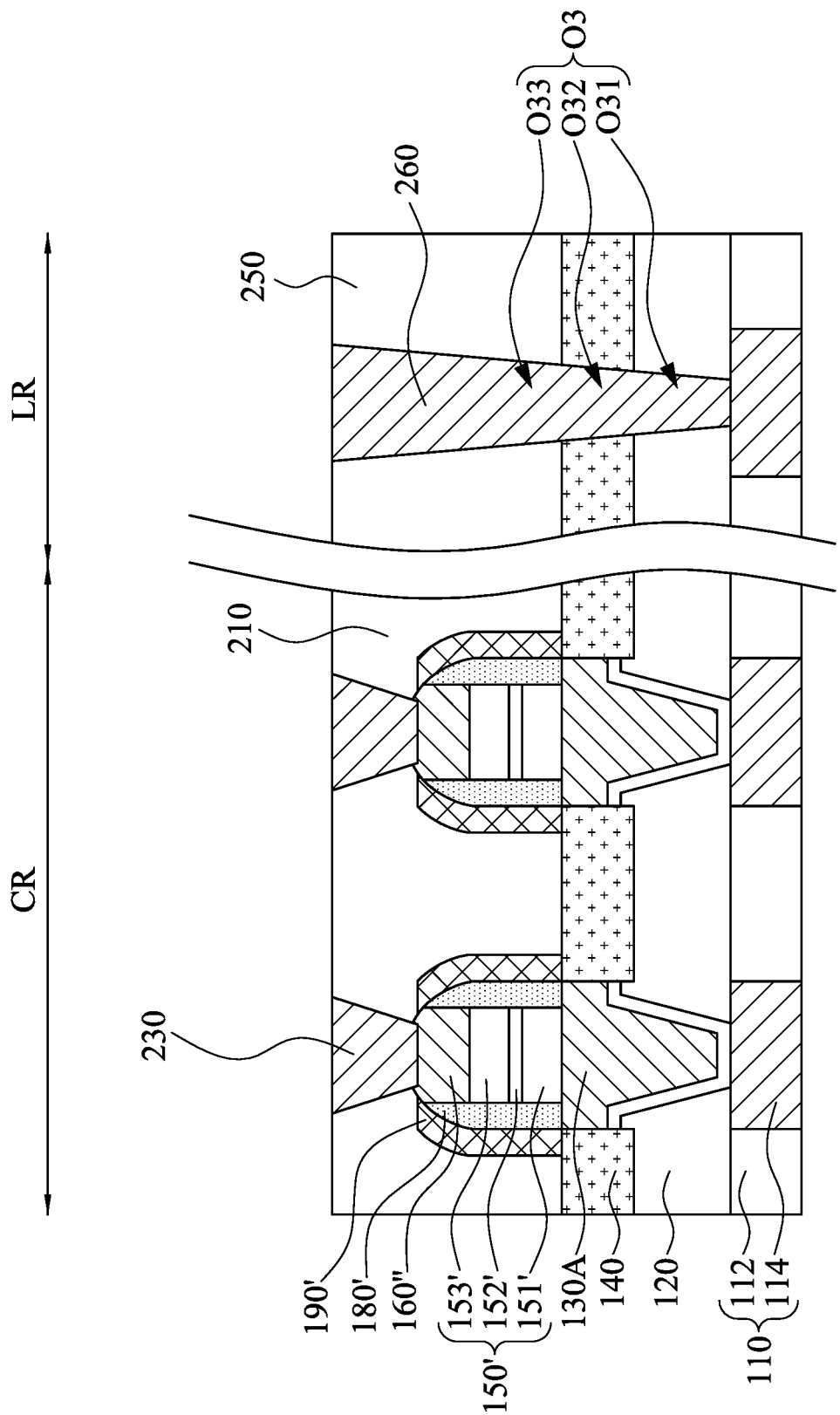

Reference is then made to FIG. 19. In some subsequent processes, an ILD layer 250 is formed in the logic region LR over the substrate 110. Trenches or openings O3 are formed in the dielectric layer 120, the etch stop layer 140, and the ILD layer 250 to exposed the underlying metallization pattern 114, and conductive features 260 may be formed in the trenches or openings O3 to connect the metallization pattern 114 in the logic region LR. Herein, the dielectric layer 120 has an opening O31, the etch stop layer 140 has an opening O32, and the ILD layer has an opening O33. The opening O31, O32, and O33 may be etched by different etching process and different etchants. The openings O31, O32, and O33 in combination form the opening O3.

FIG. 20 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an MTJ stack 922, a top electrode 924 over the MTJ stack 922, a bottom electrode 926 under the MTJ stack 922. The bottom electrode 926 has a bottom portion in a dielectric layer 930 and a top portion in a etch stop layer 940. The top surface of the etch stop layer 940 may be level with the top surface of the bottom electrode 926. The MRAM devices 920 may further includes spacers 927 and 928 around the MTJ stack 922.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the M4 layer and the bottom the M5 layer. Also included in integrated circuit is a plurality of ILD layers. Six ILD layers, identified as ILD0 through ILD5 are depicted in FIG. 19 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the resistance switching elements (e.g. MTJ), top electrodes and/or spacers of memory devices are not damaged by the patterning process of the bottom electrode layer. Another advantage is that the OVL control for patterning the bottom electrode layer can be relaxed. Yet another advantage is that the dielectric layer surrounding the bottom electrodes extends to a logic region, and can act as a stop layer against subsequent etching processes.

According to some embodiments, a method for fabricating a memory device includes forming a bottom electrode over a substrate; forming an etch stop layer over and surrounding the bottom electrode; removing at least one portion of the etch stop layer to expose the bottom electrode; forming a stack layer over the bottom electrode and a remaining portion of the etch stop layer, the stack layer comprising a resistance switching layer; and etching the stack layer to form a stack over the bottom electrode, the stack comprising a resistance switching element over the bottom electrode and a top electrode over the resistance switching element. The etch stop layer has a higher etch resistance to the etching than that of the resistance switching element.

In some embodiments, the etch resistance of the etch stop layer to the etching the stack layer is higher than that of the bottom electrode.

In some embodiments, the etch resistance of the etch stop layer to the etching the stack layer is higher than that of the top electrode.

In some embodiments, the method further includes forming a spacer layer over the stack; and etching the spacer layer to form a spacer. The etch stop layer has a higher etch resistance to the etching the spacer layer than that of the spacer layer.

In some embodiments, the removing the at least one portion of the etch stop layer over the bottom electrode includes performing a chemical-mechanical polish (CMP) process to the etch stop layer.

In some embodiments, the method further includes forming an interlayer dielectric layer over the stack and the etch stop layer; and removing a portion of the interlayer dielectric layer over a logic transistor.

In some embodiments, the removing the portion of the interlayer dielectric layer includes etching the portion of the interlayer dielectric layer. The etch stop layer has a higher etch resistance to the etching the portion of the interlayer dielectric layer than that of the interlayer dielectric layer.

In some embodiments, the forming the bottom electrode includes overfilling an opening in a dielectric layer with a bottom electrode layer; and removing a portion of the bottom electrode layer to form the bottom electrode. The bottom electrode is partially inside and partially outside the opening.

In some embodiments, the removing the portion of the bottom electrode layer further removes a portion of the dielectric layer.

According to some embodiments, a method for manufacturing a memory device includes forming a dielectric layer over a substrate having an metallization pattern; forming an opening in the dielectric layer to expose the metallization pattern; overfilling the opening with a bottom electrode layer; patterning the bottom electrode layer to form a bottom electrode; and forming a stack over the bottom electrode, the stack comprising a resistance switching element in contact with the bottom electrode and a top electrode over the resistance switching element.

In some embodiments, the method further includes forming an etch stop layer over the bottom electrode; and planarizing the etch stop layer until reaching the bottom electrode before the forming the stack.

In some embodiments, the forming the stack includes forming a stack layer over the bottom electrode and the etch stop layer; and etching the stack layer to form a stack over the bottom electrode, the stack comprising a resistance switching element over the bottom electrode and a top electrode over the resistance switching element. The etch stop layer has a higher etch resistance to the etching the stack layer than that of the resistance switching element.

In some embodiments, the etch resistance of the etch stop layer to the etching the stack layer is higher than that of the bottom electrode.

In some embodiments, the method further includes forming a spacer layer over the stack; and etching the spacer layer to form a spacer. The etch stop layer has a higher etch resistance to the etching the spacer layer than that of the etch stop layer.

In some embodiments, the method further includes forming an interlayer dielectric layer over the stack and the etch stop layer; and etching a portion of the interlayer dielectric layer over a logic transistor. The etch stop layer has a higher etch resistance to the etching the portion of the interlayer dielectric layer than that of the interlayer dielectric layer.

According to some embodiments, a device includes a substrate, a dielectric layer, a bottom electrode, a resistance switching element, and a top electrode. The dielectric layer is over the substrate. The etch stop layer is over the dielectric layer. A bottom of the etch stop layer and the dielectric layer form a first interface. The bottom electrode penetrates through the etch stop layer and the dielectric layer. The bottom electrode and a top of the dielectric layer form a second interface. The second interface is at higher elevation than the first interface from the substrate. The resistance switching element is over the bottom electrode. The top electrode is over the resistance switching element.

In some embodiments, the bottom electrode includes a first portion in the dielectric layer and a second portion in the etch stop layer, the first portion and the second portion have different shapes.

In some embodiments, the substrate has a logic region and a memory region, the resistance switching element is over the memory region and not over the logic region, the etch stop layer is over the memory region and the logic region.

In some embodiments, the dielectric layer is over the memory region and the logic region.

In some embodiments, the dielectric layer has a protruding portion protruding from the first interface and surrounding the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a memory device, comprising:
    forming a bottom electrode over a substrate;
    forming an etch stop layer over and surrounding the bottom electrode;
    removing at least one portion of the etch stop layer to expose the bottom electrode;
    forming a stack layer over the bottom electrode and a remaining portion of the etch stop layer, the stack layer comprising a resistance switching layer; and
    etching the stack layer to form a stack over the bottom electrode, the stack comprising a resistance switching element over the bottom electrode and a top electrode over the resistance switching element, wherein the etch stop layer has a higher etch resistance to the etching than that of the resistance switching element.

2. The method of claim 1, wherein the etch resistance of the etch stop layer to the etching the stack layer is higher than that of the bottom electrode.

3. The method of claim 1, wherein the etch resistance of the etch stop layer to the etching the stack layer is higher than that of the top electrode.

4. The method of claim 1, further comprising
    forming a spacer layer over the stack; and
    etching the spacer layer to form a spacer, wherein the etch stop layer has a higher etch resistance to the etching the spacer layer than that of the spacer layer.

5. The method of claim 1, wherein the removing the at least one portion of the etch stop layer over the bottom electrode comprises:
    performing a chemical-mechanical polish (CMP) process to the etch stop layer.

6. The method of claim 1, further comprising:
    forming an interlayer dielectric layer over the stack and the etch stop layer; and
    removing a portion of the interlayer dielectric layer over a logic transistor.

7. The method of claim 6, wherein the removing the portion of the interlayer dielectric layer comprises:
    etching the portion of the interlayer dielectric layer, wherein the etch stop layer has a higher etch resistance to the etching the portion of the interlayer dielectric layer than that of the interlayer dielectric layer.

8. The method of claim 1, wherein the forming the bottom electrode comprises:
    overfilling an opening in a dielectric layer with a bottom electrode layer; and
    removing a portion of the bottom electrode layer to form the bottom electrode, wherein the bottom electrode is partially inside and partially outside the opening.

9. The method of claim 8, wherein the removing the portion of the bottom electrode layer further removes a portion of the dielectric layer.

10. A method for manufacturing a memory device, the method comprising:
    forming a dielectric layer over a substrate having a metallization pattern;
    forming an opening in the dielectric layer to expose the metallization pattern;
    overfilling the opening with a bottom electrode layer;
    patterning the bottom electrode layer to form a bottom electrode;
    depositing an etch stop layer over the bottom electrode and the dielectric layer, wherein depositing the etch stop layer is performed such that the etch stop layer is in contact with a top surface of the bottom electrode;
    planarizing the etch stop layer until reaching the bottom electrode; and
    forming a stack over the bottom electrode after planarizing the etch stop layer, the stack comprising a resistance switching element in contact with the bottom electrode and a top electrode over the resistance switching element.

11. The method of claim 10, wherein forming the dielectric layer is performed such that the dielectric layer comprises silicon and depositing the etch stop layer is performed such that the etch stop layer comprises aluminum.

12. The method of claim 10, wherein the forming the stack comprises:
    forming a stack layer over the bottom electrode and the etch stop layer; and
    etching the stack layer to form the stack over the bottom electrode, wherein the etch stop layer has a higher etch resistance to the etching the stack layer than that of the resistance switching element.

13. The method of claim 12, wherein the etch resistance of the etch stop layer to the etching the stack layer is higher than that of the bottom electrode.

14. The method of claim 10, further comprising
    forming a spacer layer over the stack; and
    etching the spacer layer to form a spacer, wherein the etch stop layer has a higher etch resistance to the etching the spacer layer than that of the spacer layer.

15. The method of claim 10, further comprising:
    forming an interlayer dielectric layer over the stack and the etch stop layer; and
    etching a portion of the interlayer dielectric layer over a logic transistor, wherein the etch stop layer has a higher etch resistance to the etching the portion of the interlayer dielectric layer than that of the interlayer dielectric layer.

16. The method of claim 10, wherein patterning the bottom electrode layer comprises:
   forming an etch mask over the bottom electrode layer above the opening; and
   etching a portion of the bottom electrode layer exposed by the etch mask, wherein the method further comprises removing the etch mask after patterning the bottom electrode layer.

17. A method for manufacturing a memory device, the method comprising:
   forming a mask over a bottom electrode layer;
   patterning the bottom electrode layer by using the mask to form a bottom electrode;
   removing the mask from the bottom electrode;
   forming an etch stop layer adjacent the bottom electrode after removing the mask from the bottom electrode, wherein forming the etch stop layer is performed such that the etch stop layer is in contact with a top surface of the bottom electrode;
   removing a portion of the etch stop layer from the top surface of the bottom electrode;
   forming a stack over the top surface of the bottom electrode, the stack comprising a resistance switching element in contact with the bottom electrode and a top electrode over the resistance switching element, wherein forming the stack is performed such that a bottom surface of the resistance switching element is above a top surface of the etch stop layer;
   forming a spacer layer over the stack; and
   etching the spacer layer to form a spacer, wherein the etch stop layer has a higher etch resistance to the etching the spacer layer than that of the spacer layer.

18. The method of claim 17, wherein etching the spacer layer is performed such that the spacer is in contact with the top surface of the bottom electrode.

19. The method of claim 17, wherein etching the spacer layer is performed such that the spacer is in contact with the top surface of the etch stop layer.

20. The method of claim 17, wherein the top electrode has a higher etch resistance to the etching the spacer layer than that of the spacer layer.

* * * * *